United States Patent [19]

Kosugi et al.

[11] Patent Number: 5,137,363
[45] Date of Patent: Aug. 11, 1992

[54] PROJECTION EXPOSURE APPARATUS

[75] Inventors: Masao Kosugi, Yokohama; Akiyoshi Suzuki, Tokyo; Hideki Ina, Kawasaki; Hitoshi Fukuda, Tokyo, all of Japan

[73] Assignee: Canon Kabushiki Kaisha, Tokyo, Japan

[21] Appl. No.: 532,229

[22] Filed: Jun. 5, 1990

Related U.S. Application Data

[63] Continuation of Ser. No. 56,728, Jun. 2, 1987, abandoned.

[30] Foreign Application Priority Data

| Jun. 4, 1986 | [JP] | Japan | 61-128171 |
| Jun. 4, 1986 | [JP] | Japan | 61-128172 |
| Jun. 27, 1986 | [JP] | Japan | 61-149692 |

[51] Int. Cl.$^5$ .................................. H01L 21/30
[52] U.S. Cl. .................................. 356/401
[58] Field of Search .................. 356/401; 250/201 AF

[56] References Cited

U.S. PATENT DOCUMENTS

| 3,963,353 | 6/1976 | Hemstreet | 356/394 |
| 4,355,892 | 10/1982 | Mayer et al. | 356/401 |
| 4,402,596 | 9/1983 | Konatani | 356/401 |
| 4,512,642 | 4/1985 | Ito et al. | 250/201 AF |
| 4,540,277 | 9/1985 | Mayer et al. | 356/401 |
| 4,577,958 | 3/1986 | Phillips | 356/401 |
| 4,616,130 | 10/1986 | Omata | 356/401 |
| 4,685,807 | 8/1987 | Picard | 356/401 |
| 4,704,033 | 11/1987 | Fay et al. | 356/401 |
| 4,741,622 | 5/1988 | Suwa et al. | 356/401 |
| 4,758,864 | 7/1988 | Endo et al. | 356/401 |
| 4,778,275 | 10/1988 | Van den Brink et al. | 356/401 |

*Primary Examiner*—Richard A. Rosenberger
*Attorney, Agent, or Firm*—Fitzpatrick, Cella, Harper & Scinto

[57] ABSTRACT

A projection exposure apparatus for projecting a pattern formed on a first object such as a reticle upon a second object such as a semiconductor wafer by use of a projection lens system, is disclosed. In the apparatus, a light of a predetermined wavelength is used for the pattern projection, and a light having a different wavelength is used to align the first and second objects by way of the projection lens system. A dichroic mirror film is disposed inclinedly between the first object and the projection lens system so as to reflect one of the light of the predetermined wavelength and the light of the different wavelength, and also to transmit the other. By this dichroic mirror film, the light used for the alignment and reflected back from the second object is extracted out of a light path between the first and second objects. After correcting effects of chromatic aberrations of the projection lens system with respect to the different wavelength, the light for the alignment is passed through the first object. By this, accurate alignment using the light of a wavelength different from that to be used for the pattern projection, is made practically attainable. Also, use of lights of different wavelengths, other than the wavelength to be used for the pattern projection, is made practically attainable. Thus, accurate and stable alignment is attainable regardless of the configuration of the mark provided on the second object.

4 Claims, 9 Drawing Sheets

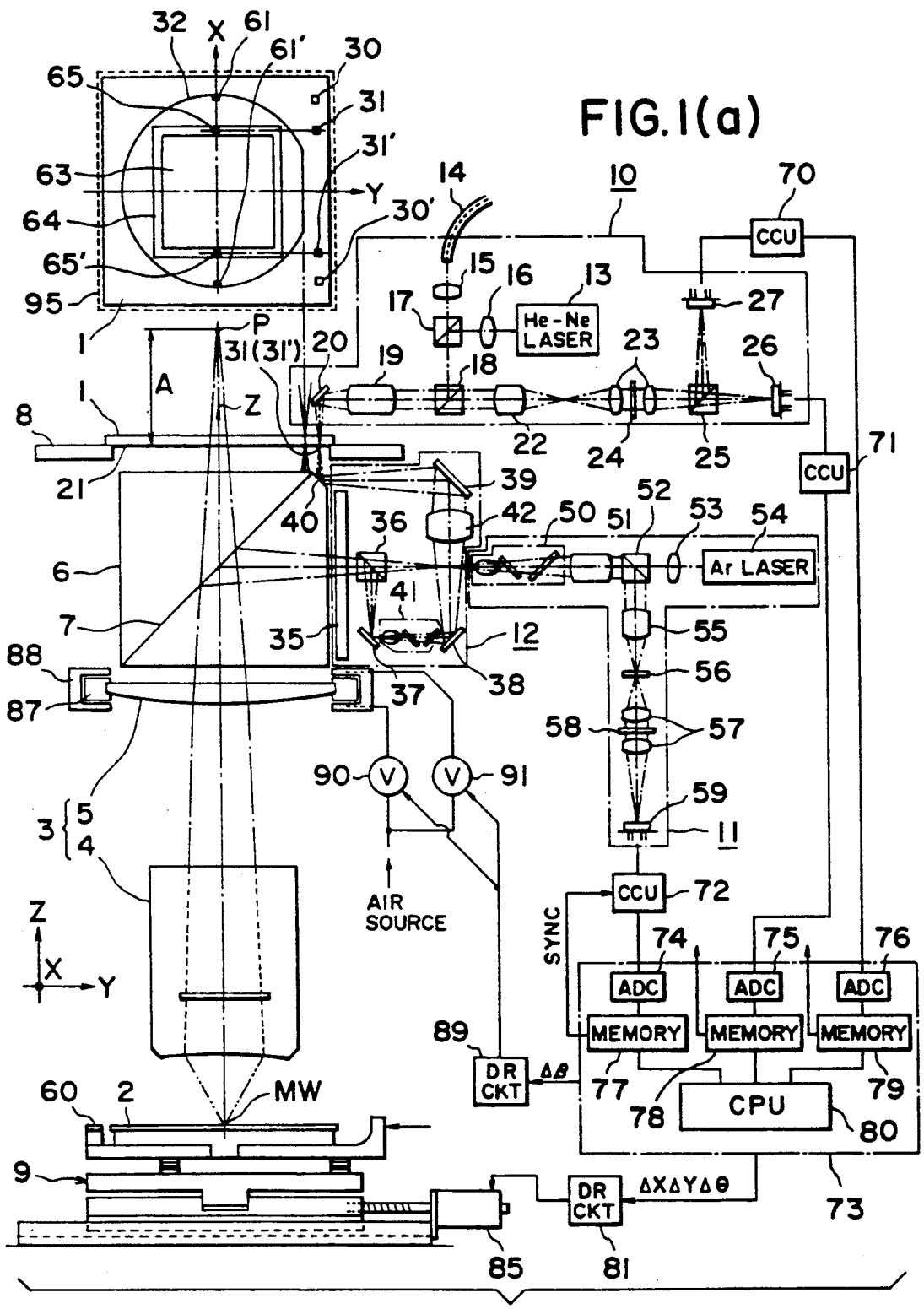

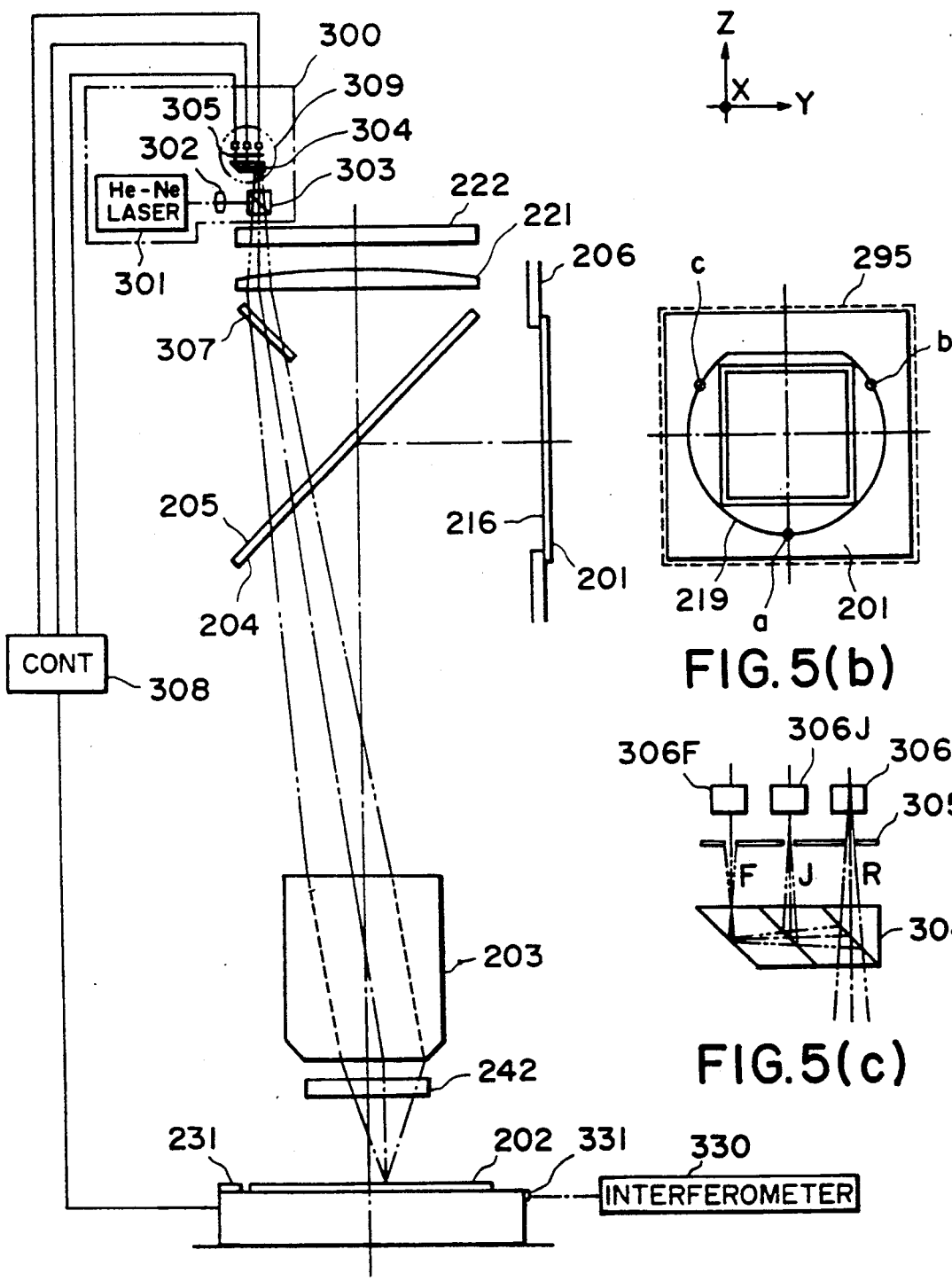
FIG. 5(a)
FIG. 5(b)
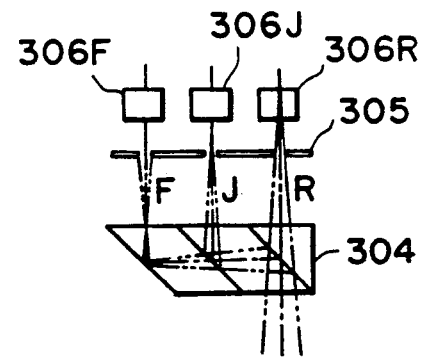
FIG. 5(c)

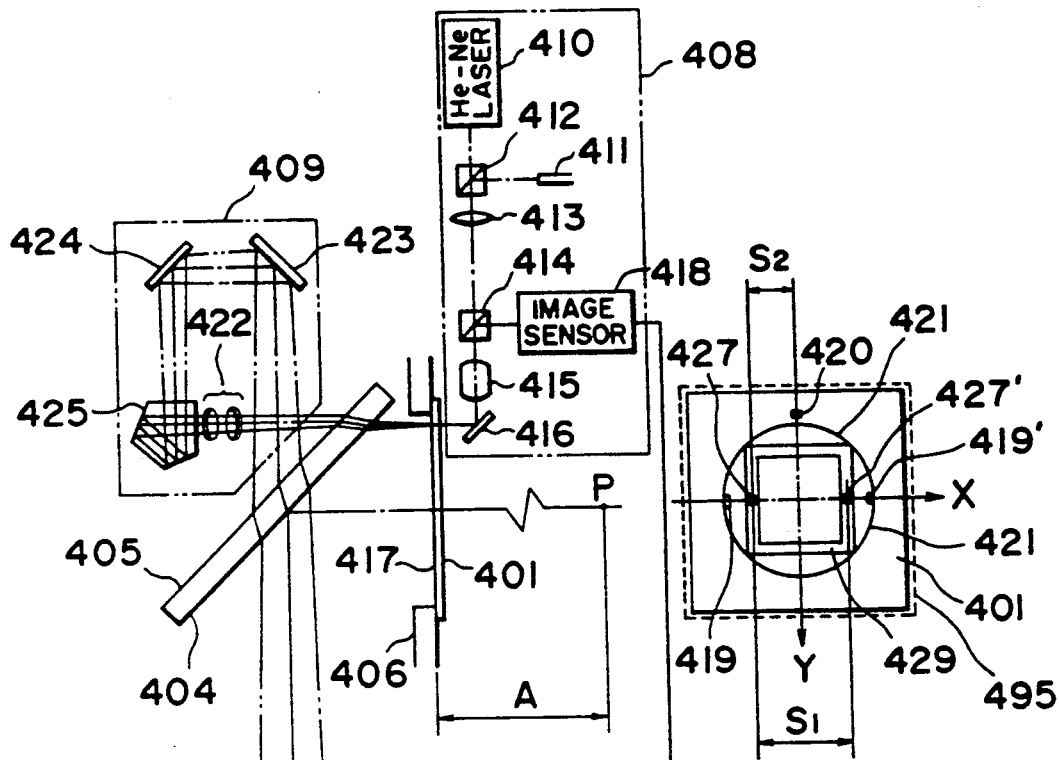
FIG.6(a)
FIG.6(b)
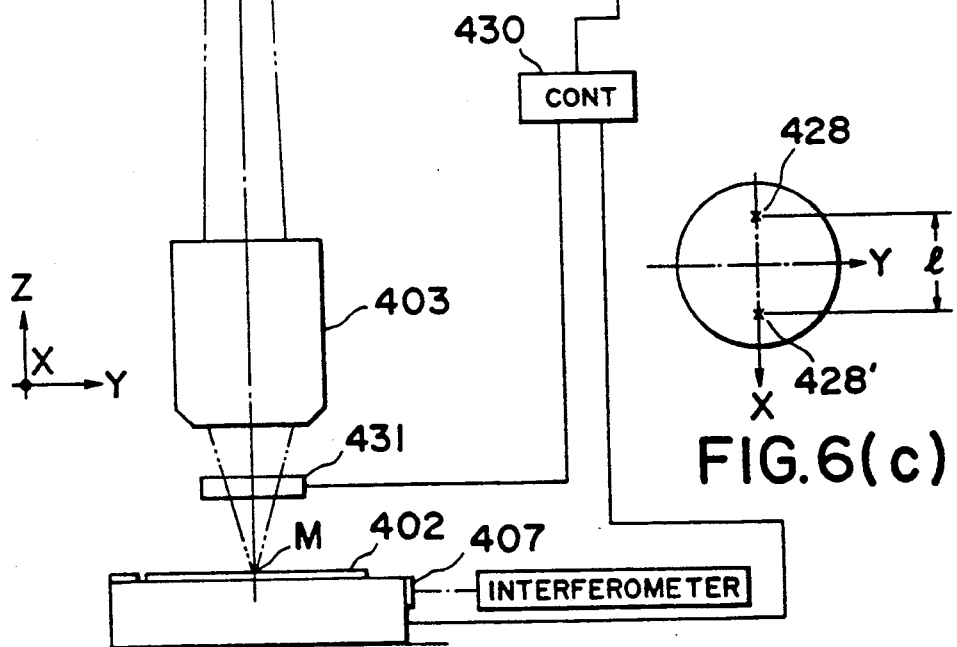
FIG.6(c)

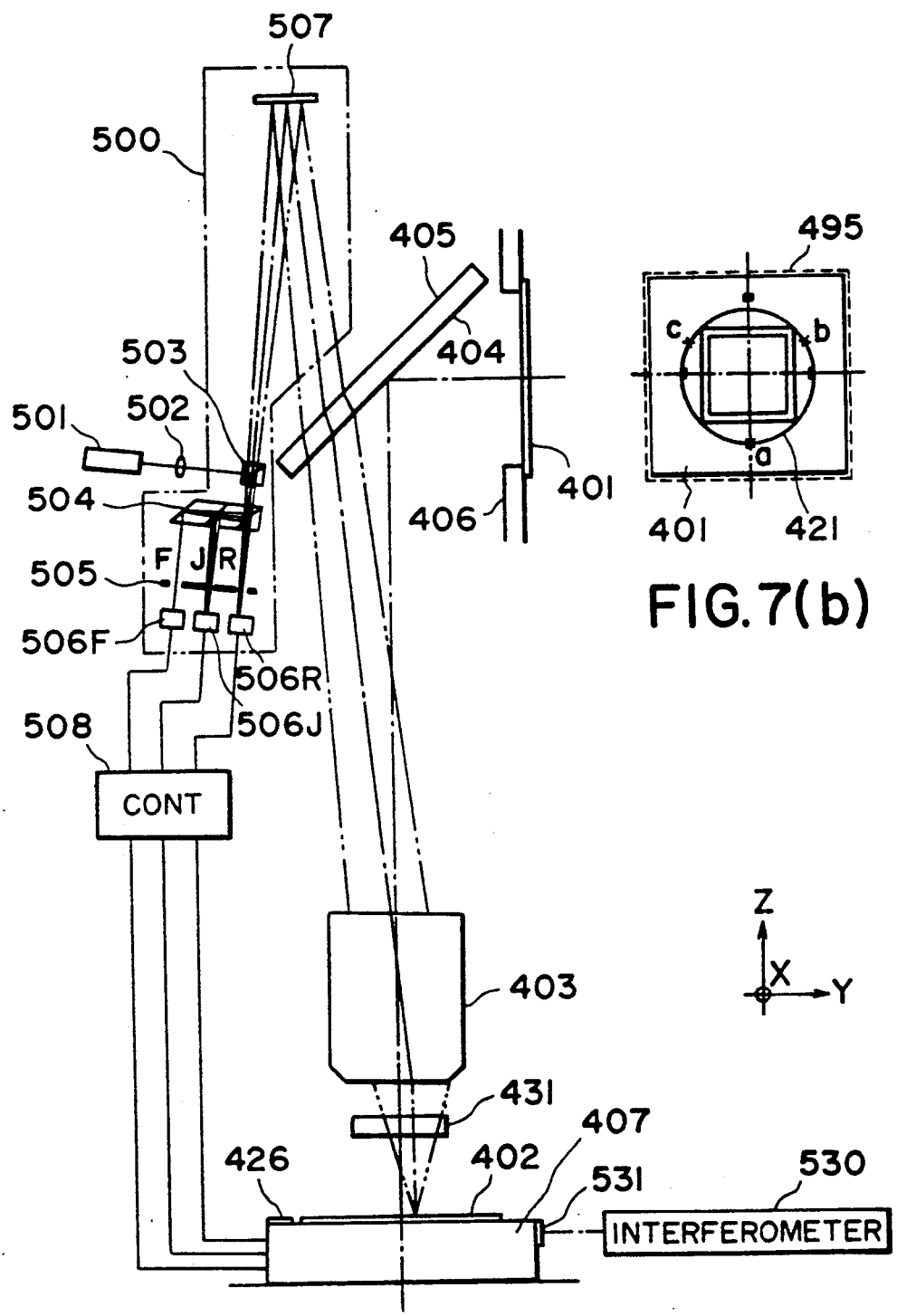

FIG. 9A1
FIG. 9B1
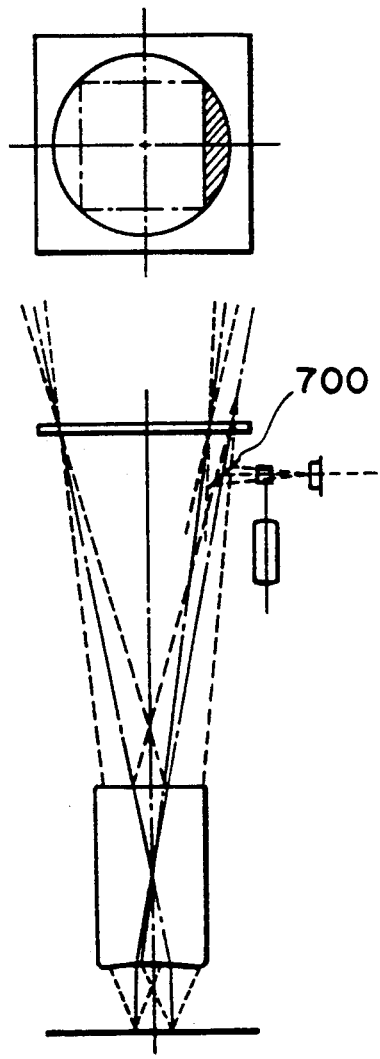
FIG. 9A2
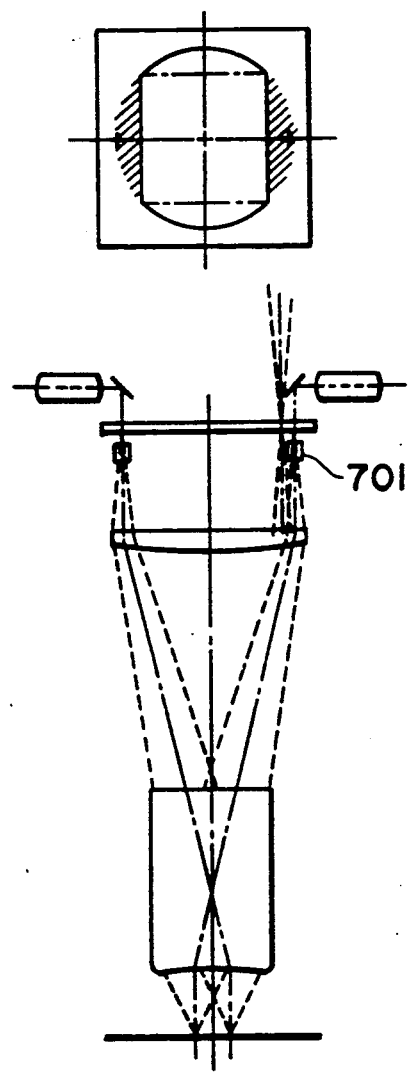
FIG. 9B2

PROJECTION EXPOSURE APPARATUS

This application is a continuation of application Ser. No. 07/056,728 filed Jun. 2, 1987, now abandoned.

FIELD OF THE INVENTION AND RELATED ART

This invention relates to a projection exposure apparatus usable, for example, in a photolithographic process which is one of the manufacturing processes for manufacturing semiconductor devices such as integrated circuits, large scaled integrated circuits, etc.

Many proposals have been made with respect to alignment systems in projection exposure apparatuses of the type using reduction projection lenses called "steppers", and some of these proposals have actually been applied to practical apparatuses. Briefly, these proposals and applications are made in an attempt to achieve an alignment and exposure process (i) at higher accuracy, (ii) with certainty and (iii) in a shorter time. The alignment and exposure process is a process for relatively aligning a pattern of a reticle and a pattern already photoprinted on a wafer, by way of a projection lens system and, thereafter, for exposing the wafer to the reticle pattern so as to photoprint the reticle pattern on the wafer. In addition to these requirements (i)-(iii), it may be a requirement to (iv) facilitate use of the apparatus at the user's side.

However, it is not easy to practically satisfy all of these requirements at once. Generally, the prior proposals and applications have insufficiency with respect to at least one of these requirements.

It may appear that the fact of failure of satisfaction of these requirements in the same stepper is an implication that the stepper inherently involves a critical problem or problems. However, these problems can be analyzed as follows:

(a) In order "more accurately" to align the wafer pattern with a projected image of the reticle pattern prior to the projection exposure, i.e. prior to the photoprinting of the reticle pattern upon the wafer pattern by use of the projection lens system, it is desirable to effect the alignment through or by way of the projection lens system. Namely, a TTL (through the lens) alignment method is desirable.

(b) In order to ensure that the light, bearing positional information about an alignment mark of the reticle or the wafer, is still effective as an information medium after it has passed through the projection lens system, the light should inevitably be one having a very narrow wavelength range in consideration of the effect of aberrations caused by the projection lens system.

(c) Usually the alignment mark of the wafer is formed by a surface step (protrusion or recess). When a light of a narrow wavelength range is projected upon such wafer alignment mark, there is a possibility that the light reflected from an upper edge of the surface step interferes with the light reflected from a lower edge (lower corner) of the surface step. As a result, depending on the height of the step and/or the conditions such as the refractive index of a resist material applied to the wafer surface, it is possible that the optical signal (reflected light) is diminished and, in a worst case, no optical signal is detectable. Accordingly, in order to ensure achievement of alignment "with certainty" regardless of the process conditions, it is desirable to execute the alignment by use of plural alignment lights having different wavelengths.

(d) Where, for the alignment purpose, a light of a wavelength the same as that used for the "exposure" or "photoprinting" is used, there occurs no chromatic aberration in the projection lens system. This allows one to observe or detect the reticle alignment mark and the wafer alignment mark at the same time and as two-dimensional images, without using any additional optical system. In this respect, therefore, it is proper to use, as one of the alignment wavelengths, a wavelength the same as the photoprinting wavelength.

(e) Where a wavelength other than the photoprinting wavelength is used, there occurs chromatic aberration when the light of the non-photoprinting wavelength passes through the projection lens system. Although it is possible to resolve, with optical theories, such chromatic aberration into several kinds of aberrations, generally it can be stated that the prior proposals and applications described hereinbefore have paid attention only to longitudinal or axial chromatic aberration. Correction of the axial chromatic aberration, only, necessarily results in that only such an alignment mark that extends in a sagittal direction (i.e. extending radially outwardly with respect to the optical axis of the projection lens system) can be used. As a consequence, only such a component of the positional deviation that is in a direction perpendicular to the longitudinal direction of the alignment mark can be detected. Accordingly, in order to accomplish the alignment in two orthogonal X and Y directions, it is necessary to use a microscope system including two objective lenses.

(f) The restriction of the position of the alignment mark with respect to the projection lens system causes various inconveniences.

i) For example, where the alignment system is constructed so that the alignment mark is detectable only when it is on an axis of an X-Y co-ordinate system whose origin is on the optical axis of the projection lens system, and if there occurs a necessity of renewing the wafer alignment mark, inevitably the wafer alignment has to be made by shifting, relative to the projection lens system, a current shot area of the wafer which is the device pattern region that is going to be exposed to the reticle pattern. In such a case, however, a portion of the device pattern region becomes out of the effective image field of the projection lens system, because of the shift of the wafer. Thus, the effective image field of the projection lens system is substantially narrowed.

ii) In order to avoid this problem, it may be possible to shift, in the interrelation of the reticle and the wafer, the alignment mark superimposing position from the circuit pattern superimposing position by a predetermined distance. In such a case, however, it is necessary to move, by the predetermined distance, the wafer or the reticle after completion of the reticle-to-wafer alignment and before the initiation of the exposure. This movement requires a certain time which hinders "reduction in time". Also, the invervention of the moving precision leads to deterioration of the "accuracy".

(g) When, on the other hand, a light of a nonphotoprinting wavelength is used as the alignment light, the light beam emerging from a point on the wafer surface (image surface) is usually imaged at a position beyond the pattern bearing surface of the reticle (object surface) due to the axial chromatic aberration of the projection lens system. If it is desired to detect such imaging light at the imaging position beyond the reticle, it is necessary to form in the reticle a large window for allowing passage of the imaging light.

SUMMARY OF THE INVENTION

It is accordingly a primary object of the present invention to provide an improved projection exposure apparatus by which various problems and inconveniences described hereinbefore are fully obviated.

It is another object of the present invention to provide an improved projection exposure apparatus for optically projecting a pattern of an original such as a reticle upon a workpiece such as a semiconductor wafer by use of a projection optical system, the projection exposure apparatus including an alignment optical system for achieving alignment of the reticle and the wafer, wherein the alignment optical system has s specific arrangement that allows suitable matching of the alignment optical system with the whole arrangement of the apparatus including the projection optical system.

It is a further object of the present invention to provide a high-accuracy and multifunction projection exposure apparatus that satisfies strict requirements made in the field of semiconductor devices, such as further miniaturization, higher capacities, higher response-speed, etc.

In the course of accomplishing the present invention, the following considerations have been made by the inventors of the subject application.

Viewing the tendency to higher capacities and higher response-speed of the semiconductor devices while taking dynamic random access memories (DRAMs) as an example, currently 1-megabit DRAMs are going to be manufactured in mass production. The 1-megabit DRAMs are designed in an approximately 1-micron design rule. In the future, for the manufacture of 4-megabit DRAMs or 16-megabit DRAMs, 0.7-micron or 0.5-micron linewidth will be required as the design rule. Thus, the so-called "submicron process" will have to be practiced. For the exposure apparatuses, in consideration thereof, a highest resolving power is first required. To meet this, much shorter wavelengths will be used in the photoprinting in place of longer wavelengths and, in this trend, g-line ray photoprinting which is currently adopted will be replaced by i-line ray photoprinting or, alternatively, 308 nm photoprinting or 249 nm photoprinting using an excimer laser.

Use of a single wavelength or a narrower wavelength range for the photoprinting will be advantageous with respect to the resolving power and the depth of focus. However, in the field of designing of projection lens systems, higher and higher resolving powers (i.e. higher and higher numerical apertures) will be inevitably pursued. Accordingly, the depth of focus will be of an order of ±1 micron in the practical resolving power.

While it is known that the focus position is variable with temperature and pressure, it is also changeable as a result of irradiation of the light for the photoprinting. In order to retain constant resolution precision regardless of such environments, a TTL (through the lens) focusing technique for detecting the state of focus through the projection lens system will be effective. The manner of focus signal detection may be similar to that of the alignment signal detection in the automatic alignment.

Further examination of the problem of the depth of focus will encounter the problem of a warp of the wafer surface. In consideration of this, it is very desirable to provide the exposure apparatus with a three-point measuring type TTL focus detecting system in combination with a wafer tilt mechanism, as in an embodiment of the present invention which will be described later.

In addition to the improvement in the resolving power, an improvement in the pattern superimposition accuracy is also required for the exposure apparatus. Usually, a value of approximately one-third to one-fifth of the design rule linewidth of a semiconductor device is required as the corresponding superimposition accuracy. The superimposition accuracy can be resolved, in terms of factors on the apparatus side, into the magnification, the distortion and the alignment accuracy. The alignment operation is a work which aims at relatively aligning a projected image of the reticle with a pattern already photoprinted on the wafer in each of the X, Y and $\theta$ (rotational) directions contained in a plane parallel to the image surface of the projection lens system so as to completely superimpose the projected image of the reticle upon the wafer pattern. If, however, there exists a relative magnification error or a relative distortion between the projected image of the reticle and the wafer pattern, such magnification error or distortion cannot be corrected by the alignment operation.

As for the distortion which is a non-linear error or a random error with respect to an absolute grating set as an ideal shot layout on a wafer, the distortion cannot be removed or suppressed without making efforts on the side of lens designing or manufacturing.

On the other hand, it is known that the magnification, which is an expansion/contraction component proportional to the distance from the optical axis of the projection lens system, is variable with pressure. Also, the magnification is changeable with temperature or as a result of the execution of exposure. Further, there occurs, on the wafer side, expansion/contraction of the wafer pattern due to the heat application or the like. Accordingly, in order to satisfy much high superimposition accuracy of an order not greater than 0.1 micron, it is very desirable to provide the exposure apparatus with a function of detecting and correcting the magnification in real time.

From the foregoing, it can be stated that an exposure apparatus which can meet the submicron linewidth process should desirably have, not only improved alignment accuracy, but also a specific function for detecting and correcting errors resulting from both the process side and the apparatus side, with regard to the focus position, the magnification and the local defocus due to the tilt of the wafer surface.

On the basis of these considerations, the present invention in one aspect thereof uses light selecting means, disposed between an original such as a reticle and a photosensitive workpiece such as a wafer having a photoresist surface layer, for substantially transmitting one of (i) a light of a wavelength to be used for the photoprinting and (ii) a light of another wavelength to be used for the alignment and not to be used for the photoprinting. This allows introduction of the alignment light into the path of the photoprinting light from outside thereof and, additionally, allows the extraction of the alignment light out of the path of the photoprinting light.

In accordance with another aspect of the present invention, there are provided, in addition to the light selecting means, a first optical system and a second optical system cooperative with each other to allow simultaneous observation and detection of an alignment mark of the original and an alignment mark of the photosensitive workpiece. This simultaneous observation is effective to detect any error in a reference resulting from a change, with time, in the process conditions.

In accordance with a further aspect of the present invention, there is provided a third optical system adapted to be used with a second alignment light of a wavelength different from those used in the first and second optical systems. The third optical system is provided to accomplish alignment of the photosensitive workpiece with respect to a reference set in the optical system.

In accordance with a still further aspect of the present invention, an optical system serviceable as a portion of a TTL focus detecting system is provided, thereby to ensure uniform and superior resolution performance over the whole range of exposure or photoprinting.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. i(a) and 1(b) are schematic views of an alignment detecting system and a driving system included in a projection exposure apparatus according to one embodiment of the present invention.

FIGS. 5(a)–5(c) are schematic views of a focus detecting system and a driving system which can be included in the projection exposure apparatus of the FIG. 4 embodiment.

FIGS. 6(a)–6(c) are schematic views of an alignment detecting system and a driving system included in a projection exposure apparatus according to a further embodiment of the present invention.

FIGS. 7(a) and 7(b) are schematic views of a focus detecting system and a driving system which can be included in the projection exposure apparatus of the FIG. 6 embodiment.

FIGS. 9A1, 9A2, 9B1 and 9B2 are schematic views showing optical arrangements of known type projection exposure apparatuses.

DESCRIPTION OF THE PREFERRED EMBODIMENTS

Figure 2B:
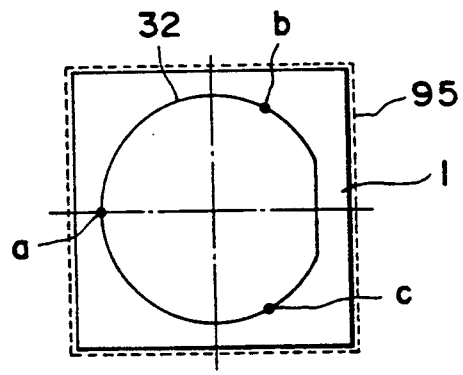
FIG. 2(a) and 2(b) are schematic views of a focus detecting system and a driving system included in the projection exposure apparatus of the FIG. 1 embodiment.

FIG. 1 schematically shows an alignment detecting system, an alignment driving system and a magnification-correcting driving system all included in an exposure apparatus according to an embodiment of the present invention. The part (a) of FIG. 1 illustrates general structures of these systems in a side view, while part (b) of FIG. 1 shows, in a plan view, a reticle usable with the exposure apparatus.

In the apparatus of FIG. 1, a projection lens system 3 and a prism block 6 are provided so as to optically project a pattern, formed on a reticle 1, upon the surface of a wafer 2, i.e. to photoprint the reticle pattern on the wafer 2 surface. The projection lens system 3 is provided by a lens front group 4 and a field lens 5, and is arranged so as to be telecentric both on the reticle 1 side and on the wafer 2 side with respect to a light of a particular wavelength to be used for the photoprinting. Although a variety of wavelengths are usable, it is assumed in this embodiment that the projection lens system 3 is designed for use with i-line rays (365 nm in wavelength). The prism block 6 is provided with a dichroic mirror film (dichroic film) 7 disposed inclinedly by 45 degrees with respect to an optical axis of the projection lens system 3. This dichroic film 7 is provided in the form of a thin film member (pellicle), and is made to transmit the photoprinting wavelength (i-line rays, in this example) while reflecting a light of another wavelength or wavelengths to be used for the alignment (e.g. a light having wavelengths not less than 500 nm). As seen from FIG. 1, the dichroic film 7 extends over the range of the section of the optical path defined by the projection lens system 3.

The reticle 1 is held by a reticle holder 8 by vacuum suction or the like. On the other hand, the wafer 2 is held by a wafer stage 9 which is movable in six directions, i.e. an X-axis direction, a Y-axis direction, a Z-axis direction and rotational directions about these three axes. The exposure, i.e. the photoprinting, is executed by illuminating the reticle by use of an illumination optical system 95 disposed above the reticle 1, as schematically illustrated in the part (b) of FIG. 1.

The alignment detecting system can be divided into three blocks, i.e. a first microscope 10, a second microscope 11 and an auxiliary optical system 12. In the illustration of FIG. 1, for ease in understanding, the optical arrangement of the alignment detecting system is expanded in a plane. Also, the alignment detecting system actually includes a pair of alignment detecting units each comprising a combination of a first microscope such as at 10, a second microscope such as at 11 and an auxiliary optical system such as at 12. The unshown one of the alignment detecting units is disposed behind the illustrated unit in the direction perpendicular to the sheet of the drawing, as will be understood from FIG. 3. With regard to the co-ordinate system, for explanation, the Z-axis is set in the direction of the optical axis of the projection lens system 3, while the orthogonal X and Y axes are set in a plane perpendicular to the Z axis, as seen in the part (b) of FIG. 1.

FIRST MICROSCOPE 10

In the first microscope 10, two light sources providing two kinds of alignment lights, respectively, are used. The first light source is a He-Ne laser 13 adapted to produce a laser beam of 633 nm in wavelength. The second light source is provided by introducing the light of the photoprinting wavelength (i.e. i-line rays, in this example) from the illumination optical system 95 by means of a fiber assembly 14. Both of the two kinds of alignment lights are directed to respective illumination lenses 15 and 16 and are transmitted therethrough. A dichroic prism 17 is provided so as to transmit the i-line rays while on the other hand, to reflect the laser beam of 633 nm in wavelength from the laser 13. The light as transmitted through or reflected by the dichroic prism 17 is directed to a half prism 18. The light reflected by the half prism 18 is directed by way of an objective lens 19 to an objective mirror 20, whereby it is reflected to irradiate a pattern bearing surface 21 of the reticle 1.

Inversely, the light reflected by the reticle 1 or the wafer 2 advances via the objective mirror 20, the objective lens 19 and the half prism 18, to a relay lens 22. From the relay lens 22, the light is directed by way of erectors 23 and a spatial filter 24 to a dichroic prism 25. The dichroic prism 25 is adapted to transmit the i-line rays, but to reflect the light of the wavelength 633 nm. Thus, the light of the photoprinting wavelength is transmitted through the dichroic prism 25 and is imaged upon an image sensor 26 which is provided exclusively for use with the i-line light in this example, and which comprises a charge coupled device (CCD) assembly. On the other hand, the He-Ne laser beam is reflected by the dichroic prism 25 so that it is imaged upon another image sensor 27 which is provided exclusively for use with the He-Ne laser beam and which comprises a charge coupled device (CCD) assembly, similarly. As a matter of course, all of the objective lens 19, the relay lens 22 and the erectors 23 are designed so that aberrations are satisfactorily corrected with respect to two different wavelengths, i.e. the wavelength 365 nm of the i-line rays and the wavelength 633 nm of the He-Ne laser beam in this embodiment. Also, as for the spatial filter 24, one which is most suitable for the alignment detection purpose is selected.

The objective mirror 20 is made movable so as to be retracted out of the path of the photoprinting light to allow "exposure" of the portion of the reticle (wafer 2), being observed, to the photoprinting light at the time of pattern projection, i.e. the photoprinting. In the first microscope 10, the whole optical arrangement or a portion thereof including the objective lens 19 and the objective mirror 20 is made movable so as to allow observation of reticle setting marks 30 and 30' and reticle alignment marks 31 and 31' (the part b in FIG. 1) as well as almost all of an effective exposure region 32 defined on the reticle 1.

AUXILIARY OPTICAL SYSTEM 12

The auxiliary optical system 12 is provided in order (i) to direct, to one of alignment marks MW formed on the wafer 2, the He-Ne laser beam emitted from the first microscope 10 and passed through the reticle alignment mark 31 (or 31'), and also (ii) to direct backwardly the He-Ne laser beam reflected from the wafer alignment mark MW while sufficiently correcting various chromatic aberrations caused by the projection lens system 3 so that the light reflected from the wafer alignment mark MW is imaged upon a portion of the pattern bearing surface 21 of the reticle 1, close to the reticle alignment mark 31 (or a 31').

The structure of the auxiliary optical system will now be described, in terms of the light reflected from the wafer alignment mark MW. The light from the wafer alignment mark MW is projected upon the prism block 6 by the projection lens system 3. If the dichroic film 7 is absent, then the light will be imaged at a point P which is at a distance A above the pattern bearing surface 21 of the reticle 1. This is because of the longitudinal or axial chromatic aberration caused by the projection lens system 3. When a light of a wavelength 633 nm is used with a projection lens system designed for exclusive use with i-line rays, as in the present embodiment, the distance A will be of an order of several tens of milimeters. If, in such a case, it is desired to detect optical signals concerning the wafer 2 from above the reticle 1, it will be necessary to form a large window in the pattern bearing surface 21 of the reticle 1. However, the provision of such a window is practically impermissible.

This is the reason why the inventors have proposed the illustrated arrangement to temporarily extract the optical signals concerning the wafer 2 out of the path, defined for the photoprinting light, on a side below the reticle 1. The light reflected by the dichroic film 7 is transmitted through a telecentricity-correcting optical system 35 and thereafter is reflected downwardly by a dichroic prism 36. The telecentricity-correcting optical system 35 is provided to correct any error in the telecentric characteristics of the projection lens system 3 caused with respect to the He-Ne laser beam, thereby to assure that the He-Ne laser beam emerging from the dichroic prism 36 is directed back to the reticle 1 in a generally correct telecentric state. For example, the correcting optical system 35 comprises an aspherical lens. Use of such correcting optical system effectively avoids adjustment of the spatial filter 24 and/or adjustment of optical elements on both sides thereof in accordance with a change in the image height resulting from a change in the position of the alignment mark.

The light reflected from the dichroic prism 36 is directed toward the reticle alignment mark 31 (or 31') by means of mirrors 37, 38 and 39 and by use of a mirror surface 40 which is formed on a portion of the prism block 6. On the way to the reticle 1, there are provided an astigmatism-and-coma correcting optical system 41 and an imaging lens 42.

Briefly, the correcting optical system 41 is provided to correct astigmatism and coma caused by the projection lens system 3 in relation to the "chromaticity", i.e. the difference in wavelength between the i-line rays and the He-Ne laser beam. Typically, the correcting optical system 41 comprises three parallel-surface glass plates disposed inclinedly with respect to the optical axis of the auxiliary optical system 12. The leftmost one of the parallel-surface plate, as viewed in FIG. 1, is adapted to correct the coma caused by the projection lens system 3 with respect to the He-Ne laser beam. The remaining two parallel-surface plates are arranged to correct the astigmatism caused by the projection lens system 3 and the first (leftmost) parallel-surface plate with respect to the He-Ne laser beam. Details of the structure and function of such astigmatism-and-coma correcting optical system 41 are described in U.S. patent application Ser. No. 07/333,727, now U.S. Pat. No. 4,888,614, which was filed claiming a convention priority based on a Japanese Patent Application 125102/1986 filed May 30, 1986 in Japan in the name of the assignee of the subject application. Therefore, detailed description of the correcting optical system 41 will be omitted here, by reference to the aforementioned copending U.S. Pat. No. 4,888,614.

The imaging lens 42 is disposed to receive the light having formed an aerial image, and is used to re-image the same at a position on the reticle 1 close to the reticle alignment mark 31 (or 31').

The auxiliary optical system 12 is arranged to allow observation of a limited range of the image surface region (wafer surface region) corresponding to the effective exposure region 32, with the aid of displacement of the above-described optical components. When the observing position is to be shifted along the X axis, co-ordinated movement of the optical components of the auxiliary optical system 12 is denoted by numerals 36, 37, 38, 39, 41 and 42 is sufficient to meet such shift along the X axis. Where the observing position is to be shifted in the Y-axis direction, the movement of the dichroic prism 36 in this direction by an amount $\Delta Y$ as well as the movement of each of the mirrors 37 and 38 in the same direction by an amount $\Delta Y/2$, for the correction of the optical path length, are required. Also, the adjustment of the correcting optical system 41 is necessary.

SECOND MICROSCOPE 11

The second microscope 11 is provided so as to accomplish the alignment of the wafer alignment mark MW with respect to a certain reference provided in this microscope.

In this embodiment, for example, a light of a wavelength 515 nm supplied from an Ar laser 54 is used as the alignment light. The light emitted from the second microscope 11 and having the wavelength 515 nm is directed to the wafer alignment mark MW by way of the dichroic prism 36, the telecentricity correcting optical system 35, a dichroic prism 7 and the projection lens system 3. The light reflected from the wafer alignment mark MW is directed back to the second microscope 11 by way of these optical elements in a reversed order.

The second microscope 11 is somewhat similar to the first microscope, and has a structure such as follows:

The second microscope 11 includes an astigmatism-and-coma correcting optical system 50 which is similar to the correcting optical system 41 but is effective to correct the aberrations with respect to the Ar laser beam, an objective lens 51, a half prism 52, an illumination lens 53, the Ar laser 54, a relay lens 55, a reference member 56 having formed thereon a reference mark (not shown), erector lenses 57, a spatial filter 58 and an image sensor 59. The image sensor 59 is provided exclusively for use with the light of 515 nm in wavelength from the laser 54 and comprises a charge coupled device (CCD) assembly.

In the second microscope 11, the whole optical arrangement or a portion thereof including the objective lens 51 is made movable, so as to follow or meet the change in the observation range of the auxiliary optical system 12.

The foregoing description has been made to a portion of the alignment detecting system which portion is effective to convert light into electric signals.

Subsequently, description will be made to the operations to be made in sequence in the exposure apparatus and by use of the detecting system (including two detecting units).

RETICLE SETTING I

When a new reticle such as at 1 is introduced into the exposure apparatus, it is necessary to set the reticle 1 with respect to a predetermined reference provided in the apparatus. For this purpose, the whole optical arrangement of the first microscope 10 or a portion thereof including the objective lens 19 is moved to a position that allows detection of the reticle setting mark 30 (30'). In close vicinity of the pattern bearing surface 21 of the reticle 1 on which the reticle setting mark 30 (30') is formed, there is provided on the apparatus side a corresponding reticle reference mark, not shown. Actually, a pair of reticle reference marks corresponding to the pair of reticle setting marks 30 and 30' are fixedly formed on the apparatus, as will be understood from the foregoing description. By use of the reticle setting marks 30 and 30' and the reticle reference marks, the alignment of the reticle 1 with respect to the exposure apparatus is accomplished. For this alignment purpose, either the alignment light of i-line rays or the alignment light of the wavelength 633 nm may be used. Also, both may be used.

RETICLE SETTING II

Figure 8A:
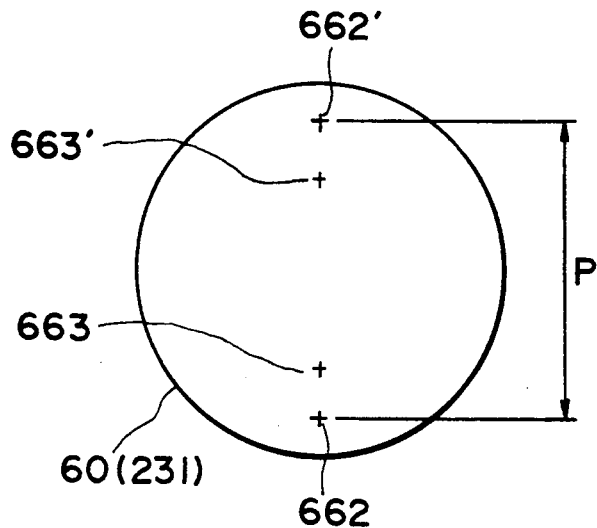
FIG. 8A is a plan view schematically showing a reference plate usable in the present invention.

The reticle setting may be executed with respect to a wafer-stage reference plate 60 which is mounted to the wafer stage 9 at a position outside the wafer 2. If this is desired, the wafer stage 9 is first moved so that the center of the reference plate is placed on or coincident with the optical axis of the projection lens system 3. On the other hand, the first microscope 10 is moved to a position that allows detection of a reticle setting mark 61 (61'). As seen in FIG. 8A, the reference plate 60 is formed with two alignment marks 662 and 662' spaced by an interval P which is in such relation to the interval S between the reticle setting marks 61 and 61' that can be expressed by an equation P=S· "reduction ratio" of the projection lens system 3 (e.g. 1/5). For the reticle setting, the i-line ray illumination system and the i-line ray detection system of the first microscope 10 are used to observe or detect, simultaneously, the left-hand set of marks 61 and 662 and the right-hand set of marks 61' and 662'. On the basis of this detection, the alignment of the reticle 1 in the X, Y and $\theta$ (rotational) directions is attainable. Also, from the runout value of the two detecting units (i.e. the difference between the detected positional deviations), any error $\Delta \beta$ in the magnification of the projection lens system 3 can be detected. The correction of such magnification error $\Delta \beta$ will be described later.

ON-AXIS ALIGNMENT USING I-LINE RAYS

When the first microscope 10 is to be used as an alignment system utilizing only the i-line rays, it can be operated as an on-axis microscope not including the auxiliary optical system 12. If this is desired, the microscope 10 is moved to a position that allows detection of reticle alignment mark 65 (65') which is formed in a scribe region 64 defined around an actual-element pattern region 63 of the reticle 1. Of course, the unshown microscope corresponding to the first microscope 10 is moved similarly. Thus, the two reticle alignment marks 65 and 65' and the two wafer alignment marks MW are observed and detected simultaneously, thus allowing the alignment with respect to the X, Y and $\theta$ directions as well as the detection of any error in the magnification $\beta$. In the case of on-axis alignment, it is necessary to retract the objective mirror 20 out of the path of the photoprinting light at the time of "exposure".

Also, at the same time as the on-axis alignment, the objective lens of the second microscope 11 may be moved to a position observing the wafer alignment mark so as to execute, simultaneously, the wafer alignment using the light of 515 nm in wavelength from the Ar laser 54.

Figure 8B:
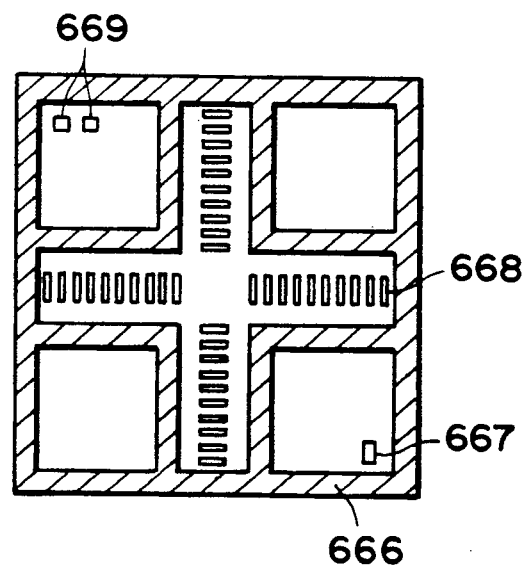
FIG. 8B is an enlarged plan view showing an example of reticle alignment mark and a wafer alignment mark, usable in the present invention.

As for the alignment marks to be used in various alignment operations, any one of a variety of alignment marks having various directional characteristics may be used in the present invention. An example is illustrated in FIG. 8B. In an exposure apparatus having multiple alignment modes as in the case of the present embodiment, it will be desirable to use marks having a common shape. In consideration thereof, in the present embodiment, each of the marks denoted by numerals 30, 30'; 31, 31'; 61, 61'; and 65, 65'is formed as a reticle mark having a configuration such as denoted at 666 in FIG. 8B, the hatched region depicting a light-intercepting region. For enhanced distinguishability of the marks for an operator and/or the exposure apparatus, these reticle marks may desirably have their own identification marks such as at 667 in FIG. 8B, having different configurations. As for the wafer alignment marks MW as well as other marks such as at 662 and 662' shown in FIG. 8A, each of these marks preferably has a configuration such as denoted at 668 in FIG. 8B. Similarly, these marks may preferably have their own identification marks such as denoted at 669.

OFFSET CORRECTION IN THE ALIGNMENT DETECTING SYSTEM USING 633 nm OR 515 nm

The alignment system using the light of 633 nm in wavelength from the He-Ne laser uses the auxiliary optical system 12. Also, the alignment system using the light of 515 nm in wavelength from the Ar laser uses the reference mark formed on the reference member 56, as an indirect reference in substitution for the reticle 1. This leads to a possibility that each alignment system involves an offset error, in the results of detection, which cannot be avoided even by the setting of the optical arrangement thereof. It is therefore necessary to "read" and then correct the offset error once the setting of the optical arrangement is changed. In the present embodiment, however, the i-line ray alignment mode using the first microscope 10 does not at all involve such systematic offset error. The present embodiment utilizes this. Namely, the i-line ray alignment by the first microscope 10 is used as a "reference" upon reading and correction of any offset error involved in the alignment systems using the wavelengths 633 nm and 515 nm, respectively. The manner of detection and correction is as follows:

(1) First, the first microscope 10 is moved to a position that allows detection of the reticle alignment mark 65 (65'). Then, by use of the i-line ray alignment system, alignment marks 663 (663') formed on the reference plate 60 are brought into alignment with the reticle alignment mark 65 (65').

(2) Subsequently, in this state, the positional relation between the alignment mark 663 (663') of the reference plate 60 and the reference mark provided on the reference member 56 is detected by the image sensor 59 by use of the light of 515 nm in wavelength supplied from the Ar laser 54 of the second microscope 11. From the amount of detected positional deviation therebetween, the offset error of the alignment system using the wavelength 515 nm is read. Alternatively, the position of the reference member 56 having the reference mark is adjusted until the image sensor 59 produces an output designating correct alignment of these marks.

(3) The first microscope 10 is moved back to the position observing the reticle alignment marks 31 (31'), so as to detect the positional relation between the reticle alignment mark 31 (31') and the alignment mark 663 (663') of the reference plate 60 by the image sensor 27 and by use of the light supplied from the He-Ne laser 13 of the first microscope 10. From the amount of detected positional deviation, the offset error of the alignment system using the wavelength 633 nm is read.

By the above-described operations, the detection (correction) of the offset error is accomplished. It is to be noted that the offset correction is attainable without providing the alignment marks 663 and 663' on the reference plate 60. For example, first the i-line ray alignment system is used to align the alignment mark 662 of the reference plate 60 with the mark 65 of the reticle 1 and, after completion of the alignment and while maintaining the correctly aligned state, the Ar laser beam alignment system is operated to detect the positional relation between these marks 65 and 662 by use of the image sensor 59. Subsequently, the wafer stage 9 is moved in the X-axis direction and the i-line ray alignment system is operated again to align the mark 662' of the reference plate 60 with the mark 65' of the reticle 1. After completion of the alignment, the positional relation between these marks is detected similarly by the image sensor 59. This is also with the case of the He-Ne laser beam alignment system, and the offset correction is attainable in a similar sequence and by use of the marks 65, 65', 31, 31', 662 and 662'. ALIGNMENT USING 633 nm AND 515 nm AND CONTROL SYSTEM THEREFOR FIG. 1 shows the state of alignment using the wavelengths 633 nm and 515 nm. By the action of the optical components described in the foregoing, images of the wafer alignment mark MW and the reticle alignment mark 31 (31') are formed, simultaneously, on the image sensor 27 provided for use with the He-Ne laser beam. On the other hand, upon the image sensor 59 provided for use with the Ar laser beam, images of the wafer alignment mark MW and the reference mark provided on the reference member 56 are formed simultaneously. In this case, the image sensor 26 provided for use with the i-line rays is not used.

The electric signals obtained by photoelectric conversion at each image sensor are processed by a corresponding one of camera control units (CCU) 70, 71 and 72 and, thereafter, they are supplied to a control circuit 73. In this control circuit, the electric signals are converted by a corresponding one of analog-to-digital convertors (ADC) 74, 75 and 76 into digital signals. These digital signals are supplied to a corresponding one of image memories 77, 78 and 79 so that they are stored therein. The image memories 77-79 are adapted to supply synchronization signals (SYNC) to the corresponding camera control units 70-72, respectively. During the signal processing to be made succeedingly, the image processing as well as the calculation of errors are executed thereby to detect the amount of deviation, for the alignment purpose. In this case, two series of electric signals, each series corresponding to the positional deviation in the X, Y and $\theta$ directions are produced from the two alignment systems using the He-Ne laser beam and the Ar laser beam, respectively. Whether they should be used in their average or whether only one of them should be used on the basis of good discrimination to be made to the signals, may be determined by the judgement in the apparatus itself or in accordance with the operator's instructions.

As described hereinbefore, the present embodiment includes a 633 nm alignment system using the He-Ne laser 13 and a 515 nm alignment system using the Ar laser 54. This arrangement is adapted to avoid such inconveniences as follows:

The alignment mark MW of the wafer 2 is usually formed by a surface step (protrusion or recess). When a light of a certain wavelength is projected upon such mark MW, it is possible that the light diffracted by an upper edge of the step of the mark MW interferes with the light diffracted by a lower edge (lower corner) of the mark. If this occurs, it is not difficult to photoelectrically obtain a correct signal concerning the wafer alignment mark MW. Generally, different wafers are formed with alignment marks of different step-configurations. It is therefore possible that there is an alignment mark that can hardly be detected by the 633 nm alignment system. On the other hand, it is possible that there is an alignment mark that can hardly be detected by the 515 nm alignment system. In consideration thereof, the present embodiment is provided with two alignment systems using different wavelengths, thereby to allow correct and accurate photoelectric detection of wafer alignment marks regardless of the step-configuration thereof. Also, the present embodiment is provided with an alignment system using the photoprinting wavelength (i.e. i-line rays). Use of the photoprinting-wavelength alignment system is preferable because the photoprinting wavelength is not adversely affected by the aberrations of the projection lens system, as compared with the other wavelengths, although recent improvements in the optical absorbing characteristics of a resist material (photosensitive material) applied to the wafer surface, with respect to the photoprinting wavelength, are liable to weaken the alignment light reflected from the wafer 2 when the light of the exposure wavelength is used for the alignment.

Turning back to the deviation detection, the electric signals obtained from the left-hand and right-hand alignment marks are resolved, in a central processing unit (CPU) 80, into components regarding two-dimensional X and Y directions. Then, by calculations including the compensation for the offset errors described hereinbefore, positional deviation components are determined in the form of $\Delta X_L$, $\Delta Y_L$; $\Delta X_R$, $\Delta Y_R$. Further, these deviation components are outputted from the CPU 80 as the data concerning necessary moving directions and necessary moving amounts, such as follows:

$\Delta X = (\Delta X_L + \Delta X_R)/2$ $\Delta Y = (\Delta Y_L + \Delta Y_R)/2$ $\Delta \theta = (\Delta Y_L - \Delta Y_R)/2$ $\Delta \beta = (\Delta X_L - \Delta X_R)/2$ These driving signals designating the necessary moving amounts in the X, Y and $\theta$ directions, are supplied to the wafer stage 9 from the control circuit 73. More particularly, for each of the X, Y and $\theta$ directions, a specific signal is supplied to a driving circuit 81, whereby an appropriate driving voltage is applied to a corresponding one of actuators such as at 85 in FIG. 1 to move the wafer 2 so as to remove the error $\Delta X$, $\Delta Y$ or $\Delta \theta$. The above-described detecting system and the driving system are operated in a closed loop so that the positional error is finally reduced to a value within a predetermined tolerance.

On the other hand, the signal designating any magnification error $\Delta \beta$ is supplied to a field lens driving system. Where the projection lens system is of the dual-telecentric type such as that in the present embodiment, movement of the field lens 5 along the optical axis is effective to change the projection magnification only. For example, a few microns in movement can cause a change in the magnification of a submicron order. In this embodiment, the role of driving the field lens 5 is played by an air-guide assembly 88 provided around a field lens supporting ring 87. When a magnification error signal $\Delta \beta$ is supplied to a driving circuit 89 from the control circuit 73, the driving circuit 89 responds thereto to apply driving signals to two servovalves 90 and 91. The servovalves are adapted to control the air pressures, supplied from a common air source, in accordance with the driving signals, and also to supply the thus controlled air pressures to upper and lower portions of the air-guide assembly 88, respectively. From the air-guide assembly 88, the controlled air pressures are discharged toward the lens supporting ring 87 upwardly and downwardly, respectively, along the optical axis of the projection lens system 3. By means of the pressure balance, the field lens 5 is displaced along the optical axis.

After completion of the X-Y-$\theta$ alignment and the adjustment of the magnification $\beta$ made by the above-described operations, it is possible to instantaneously start the "exposure". Since the objective mirror 20 is out of the path of the photoprinting light, it is not necessary to retract the same. Moreover, it is possible to continue the monitoring of the alignment position during the photoprinting operation, if desired.

The advantageous effects of the alignment device described in the foregoing can be summarized as follows:

(1) Use of plural alignment lights having different wavelengths and a variety of alignment modes, has prevented the detection error and the deterioration of the detection accuracy due to the nature of the process to be executed, and, as a result of which, has achieved stable and high-accuracy alignment regardless of the change in the process conditions.

(2) Even for the alignment operation using a non-photoprinting wavelength, the provision of the alignment system using the photoprinting wavelength has allowed automatic offset correction in the exposure apparatus. Also, the alignment system using the light of a wavelength 633 nm from the He-Ne laser allows simultaneous detection of the reticle alignment mark and the projected image of the wafer alignment mark. Therefore, it is not necessary to worry about any error in the reference due to aging.

(3) Since the aberrations are substantially completely corrected with respect to each of the different alignment wavelengths, it is possible to detect, with any alignment wavelength, positional deviation in two X and Y directions, on the basis of the single-point observation. As a consequence, the positional error in the X, Y and $\theta$ directions as well as any error in the magnification $\beta$ can be detected on the basis of two-point observation. Accordingly, more complete superimposition is attainable with the aid of adjustment of the wafer stage 9 in the X, Y and $\theta$ directions and of the magnification correction by the field lens 5.

(4) The provision of the telecentricity correcting plate 35 allows desired shift of the position of the objective lens. Consequently, a desired position can be selected as the alignment mark position. It is even possible to set the alignment mark position in the actual device pattern. Also, after completion of the alignment, the exposure (photoprinting) can be initiated without relative movement of the reticle 1 and the wafer 2. This effectively reduces the cycle time as well as improve the alignment accuracy significantly.

FOCUS DETECTION AND ADJUSTMENT

Figure 2A:
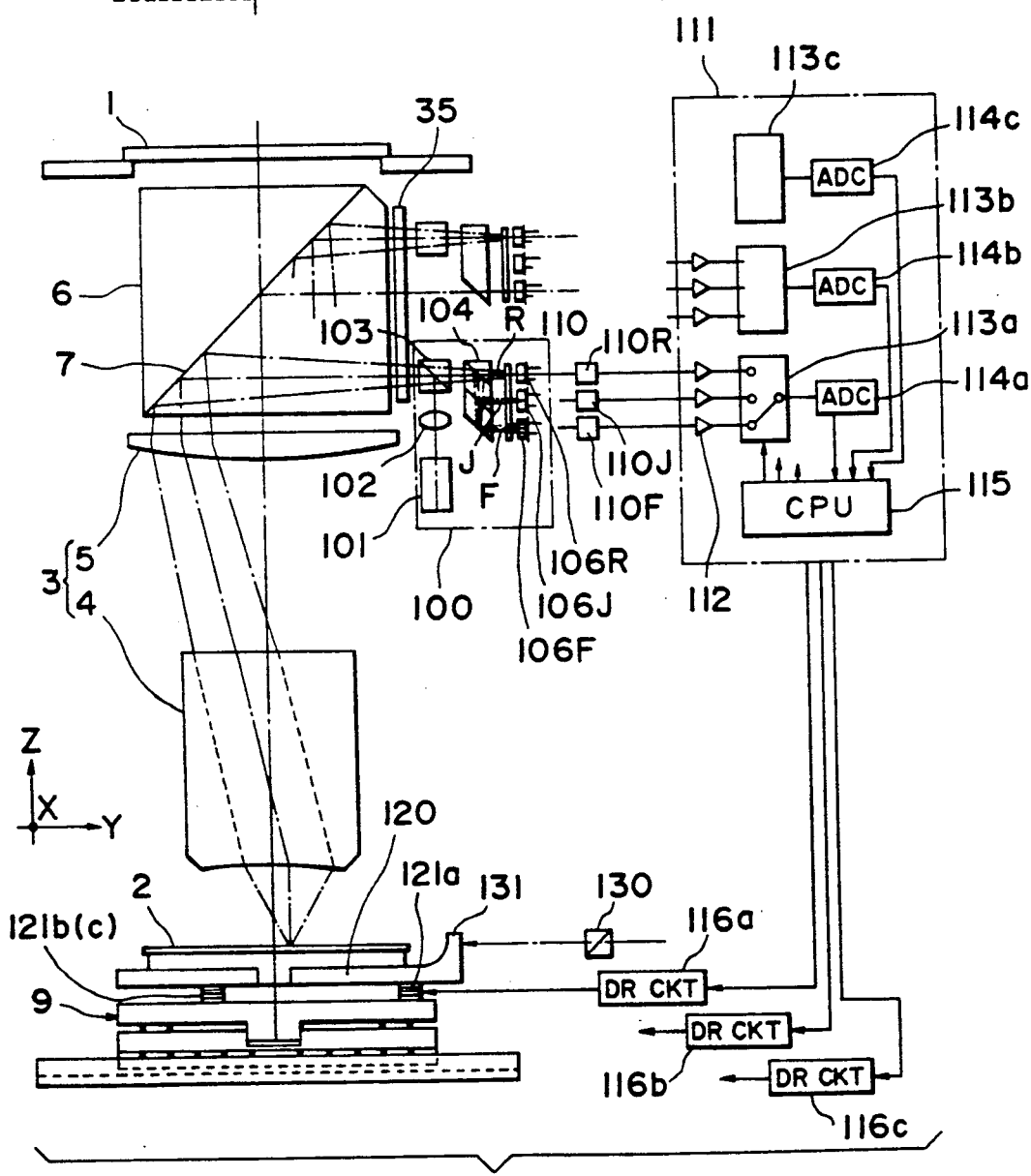

Description will now be made to the focus detection and the focus adjustment. FIG. 2 schematically shows a TTL (through the lens) focus detecting system and a driving system for the focus adjustment, provided separately from the alignment detecting system described in the foregoing. The part (a) of FIG. 2 illustrates the focus detecting system and the driving system in a schematic side view, while part (b) of FIG. 2 illustrates a reticle in a plan view.

In FIG. 2, the same reference numerals as of FIG. 1 are assigned to the same elements. The provision of the prism block 6 and the dichroic mirror 7, included therein, which are disposed in the path for the photoprinting light, does allow extraction of optical signals for the TTL focusing purpose. In the example of FIG. 2, three sets of focus detecting optical systems 100 are provided so as to detect any inclination component between the image surface defined by the projection lens system 3 and the portion of the wafer 2 surface which is going to be exposed. Considering in relation to the reticle 1 surface, these three sets of focus detecting optical systems 100 are disposed at equiangular positions corresponding to the points a, b and c on the outer periphery of the effective exposure region 32, as best seen in part (b) of FIG. 2. Only for the simplicity, description will be made to the focus detecting optical system related to the position a and a signal processing system in association therewith.

A light emitted from a He-Ne laser 101 and having a wavelength 633 nm, is transmitted through an illumination lens 102 and thereafter is reflected by a half prism 103 toward the correction plate 35 and then to the dichroic mirror 7 of the prism block 6. Then, the light from the prism 103 is directed downwardly to the wafer 2 by means of the dichroic mirror 7, the field lens 5 and the lens front group 4, whereby it is focused upon the wafer 2 surface. The light reflected from the wafer 2 surface goes backwardly along its oncoming path so that it is incident upon the half prism 103. Then, the light from the wafer 2 is passed through the half prism 103 and enters into a "multistage" half mirror 104. This half mirror 104 functions to divide the incident light into three portions of substantially the same quantity along three optical axes denoted at R, J and F. Disposed behind the half mirror 104 is a pinhole plate 105 having formed therein three pinhole windows having centers coincident with the optical axes R, J and F, respectively. Behind the plate 105, three photoelectric converting elements 106R, 106J and 106F are disposed so as to be operationally associated with the three pinhole windows, respectively. The pinhole plate 105 is so set that, when the wafer 2 surface is exactly coincident with the image plane defined by the projection lens system 3, the light emitted from the so positioned wafer surface is imaged at the pinhole position on the optical axis J, while it is imaged behind the pinhole position on the optical axis R and is imaged in front of the pinhole position on the optical axis F.

With this arrangement, the direction of deviation of the wafer surface with respect to the image plane can be discriminated on the basis of mutual comparison of the outputs of the photoelectric converting elements 106R and 106F. Also, from the balance between the outputs of the photoelectric converting elements 106R and 106F or from the maximum output of the photoelectric converting element 106J, the coincidence of the wafer surface with the image plane can be detected. The electric signals obtained by the photoelectric conversion at the photoelectric converting elements 106R, 106J and 106F are amplified by preamplifiers 110R, 110J and 110F, respectively. The amplified electric signals are supplied to a control circuit 111. In this control circuit, the electric signals are amplified again by corresponding amplifiers 112. After this, these signals are applied to an analog-to-digital converter (ADC) 114a in the form of serial signals under the influence of an analog switch 113a. After the conversion at the converter 114a, the resultant digital signals are applied to a central processing unit (CPU) 115. The control circuit 111 further includes analog switches 113b and 113c, analog-to-digital convertors 114b and 114c and so on, for processing electric signals to be supplied from two focus detecting optical systems corresponding to the positions b and c.

The CPU 115 is adapted to process the electric signals supplied from the three focus detecting systems corresponding to the three positions a–c, and produces vector signals for the actuation of three piezoelectric device assemblies 121a–121c, respectively, for moving a tilt stage 120 incorporated into the wafer stage 9. These vector signals are converted by respective driving circuits 116a–116c into driving signals which are, in turn, supplied to the piezoelectric device assemblies, respectively. By this, the title correction of the tilt stage 120 is achieved.

The series of operations described above are carried out in a closed loop as the TTL focusing using the projection lens system 3. Accordingly, the focus adjustment can satisfactorily follow the shift of image plane due to a change in an ambient pressure and/or ambient temperature as well as a rapid focus change resulting from absorption of the photoprinting light by the projection lens system 3. As a consequence, a correct focus can be retained stably and constantly.

Further, as a result of the execution of the three-point detection and the use of the tilt mechanism, the wafer surface can be made exactly coincident with the image plane. Therefore, uniform and superior resolution performance is attainable over the whole exposure range.

In a case of repeated exposures while moving the stage 9 in accordance with the measurement by a laser interferometer measuring system 130, such as in a case of a first mask process or a global alignment mode, there is a possibility that any tilt of each shot causes a problem of shot layout error (which appears as the variation in the width of the scribe line). Such a problem can be obviated by providing a reference mirror (square) 131 on the tilt stage 120.

Figure 3:
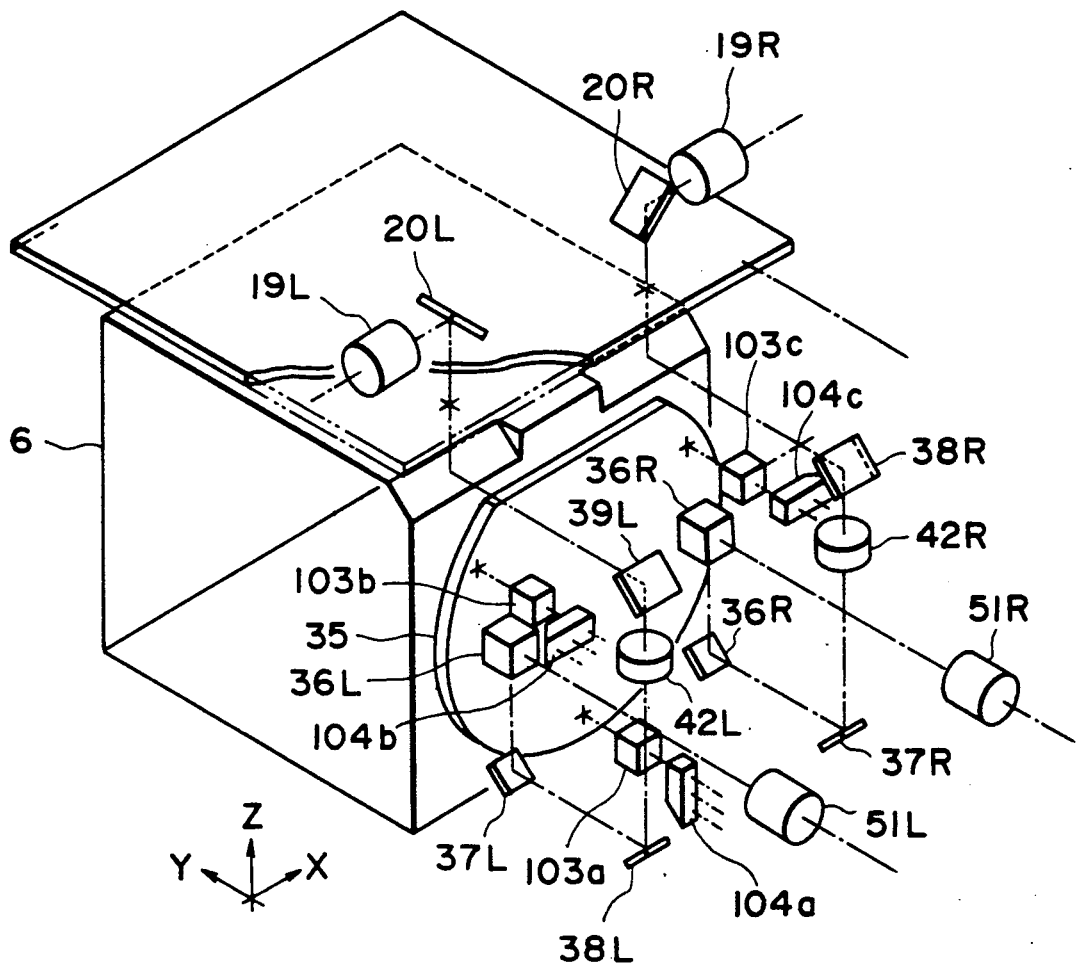
FIG. 3 is a fragmentary and perspective view, schematically showing three-dimensional positional relation of the alignment optical system and the focus detecting system shown in FIGS. 1 and 2, respectively.

FIG. 3 shows an example of three-dimensional positional relation of major components of the FIG. 1 alignment optical systems and the FIG. 2 focus detecting optical systems, when arranged in combination. It is seen that they can be combined easily.

Description will now be made to a second embodiment of the present invention.

Figure 4A:
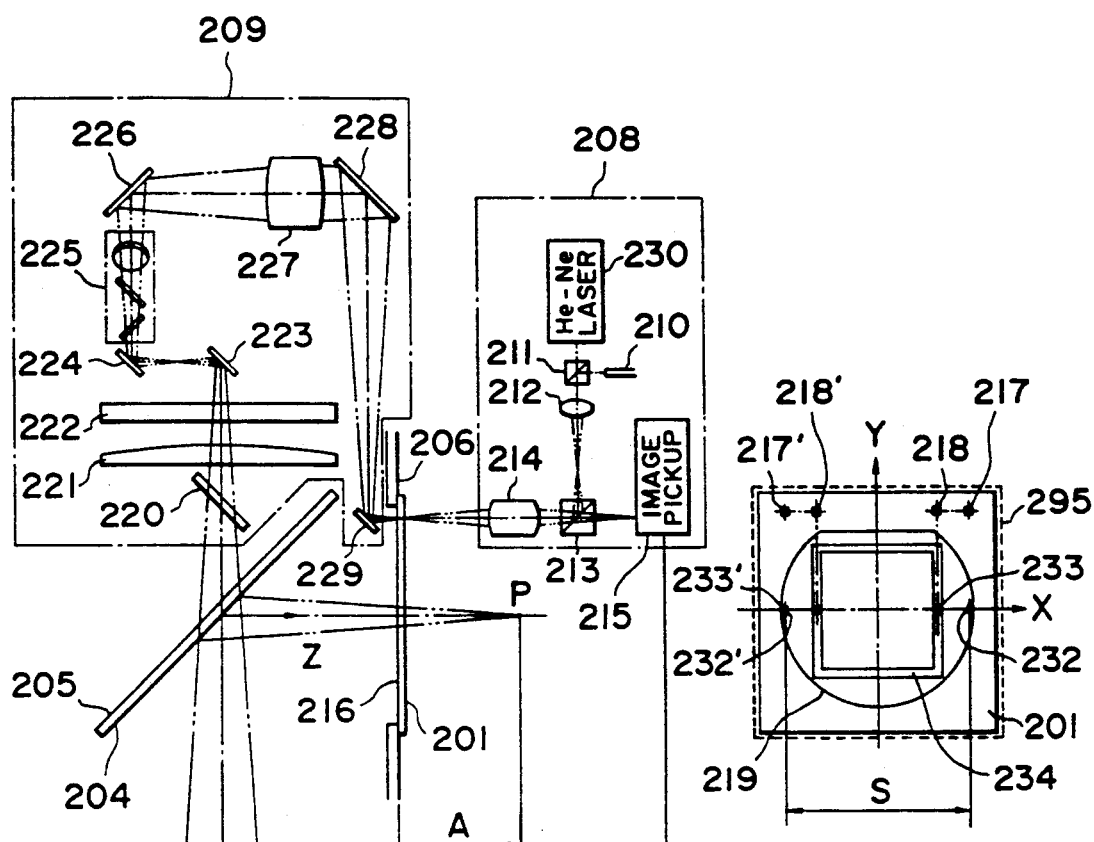
FIG. 4(a) and 4(b) are schematic views of an alignment detecting system and a driving system included in a projection exposure apparatus according to another embodiment of the present invention.
Figure 4B:
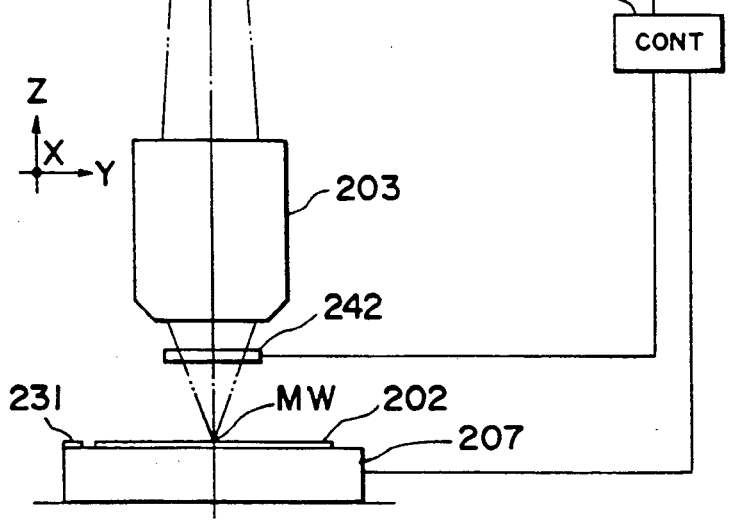

FIG. 4 schematically shows an alignment detecting system, an alignment driving system and a magnification-correcting driving system all included in an exposure apparatus according to the second embodiment of the present invention. The part (a) of FIG. 4 illustrates general structures of these systems in a side view, while part (b) of FIG. 4 shows, in a plan view, a reticle usable with the exposure apparatus.

In the apparatus of FIG. 4, a projection lens system 203 and a dichroic mirror 204 are provided so as to optically project a pattern, formed on a reticle 201, upon the surface of a wafer 202, i.e. to photoprint the reticle pattern on the wafer 202 surface. The dichroic mirror 204 is provided on a parallel-surface glass plate 205 so that it extends across an optical path defined by the projection lens system 203. The projection lens system 203 is arranged to be telecentric on the wafer 202 side, such that it is of the single telecentric type. The dichroic mirror 204 provided on the parallel-surface plate 205 is inclined by 45 degrees with respect to an optical axis of the projection lens system 203, such that the optical axis for the pattern projection is bent or deflected by the dichroic mirror 204 by an angle of 90 degrees. Namely, the dichroic mirror 204 is set so as to reflect, in a perpendicular direction, the light of the wavelength to which the resist material on the wafer is sensitive, while it transmits a light having a wavelength or wavelengths other than such sensitizing wavelength and to be used exclusively for the alignment purpose and automatic focusing purpose.

The reticle 201 is held by a reticle holder 206 by vacuum suction or the like. On the other hand, the wafer 202 is held by a movable wafer stage 207. The exposure, i.e. the photoprinting, is executed by illuminating the reticle 201 by use of an illumination optical system 295 disposed on the right-hand side of the reticle 201, as schematically illustrated in part (b) of FIG. 4.

The alignment detecting system can be divided into two blocks, i.e. a first microscope 208 and an auxiliary optical system 209. In the illustration of FIG. 4, for ease in understanding, the optical arrangement of the alignment detecting system is expanded in a plane. Also, the alignment detecting system actually includes a pair of alignment detecting units each comprising a combination of a first microscope such as at 208 and an auxiliary optical system such as at 209. The unshown one of the alignment detecting units is disposed behind the illustrated unit in the direction perpendicular to the sheet of the drawing. With regard to the co-ordinate system, for explanation, the Z-axis is set in the direction of the optical axis of the projection lens system 203, while the orthogonal X and Y axes are set in a plane perpendicular to the Z axis, as seen in part (b) of FIG. 4.

FIRST MICROSCOPE 208

In the first microscope 208, two light sources providing two kinds of alignment lights, respectively, are used. The first light source is a He-Ne laser 230 adapted to produce a laser beam of 633 nm in wavelength. The second light source is provided by introducing the light of the photoprinting wavelength (e.g. i-line rays) from the illumination optical system 95 by means of a light guide 210. The photoprinting wavelength is a wavelength which can sensitize a resist material provided on the wafer surface. Both of the two kinds of alignment lights are directed to a beam splitter 211. This beam splitter 211 is provided so as to transmit the photoprinting wavelength, e.g. i-line rays, while on the other hand, to reflect the laser beam of 633 nm in wavelength from the laser 230. The light as transmitted through or reflected by the beam splitter 211 is directed to an illumination lens system 212. The light passed through the lens 212 is directed, after being deflected by a beam splitter 213, to an objective lens 214 by which it is projected upon the reticle 201 to irradiate a pattern bearing surface 216 of the reticle 201.

Inversely, the light reflected by the reticle 201 or the wafer 202 advances via the objective lens 214 to the beam splitter 213. The light from the objective lens 214 passes through the beam splitter 213, so that it is imaged upon an image pickup device 215 which comprises, in this embodiment, a charge coupled device (CCD) assembly. As a matter of course, the objective lens 214 is designed so that aberrations are satisfactorily corrected with respect to two different wavelengths, i.e. the wavelength of the light to be used for the photoprinting and the wavelength 633 nm of the He-Ne laser beam in this embodiment. Also, the objective lens 214 has a diametrical size accepting any change in the angle of incidence of light due to a change in the image height (alignment mark position).

In the first microscope 208, the whole optical arrangement is made movable so as to allow observation of reticle setting marks 217 and 217' and reticle alignment marks 218 and 218' (the part b in FIG. 4) as well as almost all of an effective exposure region 219 defined on the reticle 201.

AUXILIARY OPTICAL SYSTEM 209

The auxiliary optical system 209 is provided in order (i) to direct, to one of alignment marks MW formed on the wafer 202, the He-Ne laser beam emitted from the first microscope 208 and passed through the reticle alignment mark 218 (or 218'), and also (ii) to direct backwardly the He-Ne laser beam reflected from the wafer alignment mark MW while sufficiently correcting various chromatic aberrations caused by the projection lens system 203 and the parallel-surface plate 205 so that the light reflected from the wafer alignment mark MW is imaged upon a portion of the pattern bearing surface 216 of the reticle 201, close to the reticle alignment mark 218 (or 218').

The structure of the auxiliary optical system 209 will now be described, in terms of the light reflected from the wafer alignment mark MW. The light from the wafer alignment mark MW is projected upon the dichroic mirror 204 by the projection lens system 203. If the mirror 204 having a dichroic film is replaced by an ordinary mirror which is reflective also to a non-sensitizing wavelength, then the light of such wavelength will be imaged, after passing the reticle, at a point P which is at a distance A behind the pattern bearing surface 216 of the reticle 201. This is because of the longitudinal or axial chromatic aberration caused by the projection lens system 203. When, for example, a light of a wavelength 633 nm (He-Ne laser beam) is used with a projection lens system designed for exclusive use with i-line rays, as in the present embodiment, the distance A will be of an order of several tens of milimeters. If, in such a case, it is desired to detect optical signals concerning the wafer 202 from the back of the reticle 201, it will be necessary to form a large window in the pattern bearing surface 216 of the reticle 201. However, the provision of such window is practically impermissible.

This is the reason why the inventors have proposed the illustrated arrangement to temporarily extract the optical signals concerning the wafer 202 out of the path, defined for the photoprinting light, between the projection lens system 203 and the reticle 201.

The light from the wafer alignment mark MW is passed through the dichroic mirror 204 and the parallel-surface plate 205, and is incident on a coma-correcting plate 220. The coma-correcting plate 220 is adapted to substantially completely remove or correct any coma caused by the passage of the light through the parallel-surface plate 205. The light passed through the coma-correcting plate 220 enters into a field lens 221, by which any inclination of chief rays due to the image height is corrected so that they extend exactly in parallel to the optical axis of the projection lens system. Subsequently, by means of a telecentricity-correcting lens 222, any shift of focus due to the image height is corrected. Thereafter, the light is directed to the reticle alignment mark 218 (218') by way of mirrors 223 and 224, an astigmatism-and-coma correcting optical system 225, a mirror 226, an imaging lens 227 and mirrors 228 and 229, in the named order.

The astigmatism-and-coma correcting optical system 225 has a structure and a function which are similar to those of the corresponding correcting optical system, described with reference to the foregoing embodiments.

The imaging lens 227 is disposed to receive the light having formed an aerial image, and is used to re-image the same at a position on the reticle 201 close to the reticle alignment mark 218 (or 218'). Also, the field lens 221 is disposed at a position effective to assure that the magnification to be established upon the imaging plane with the use of the alignment light becomes equal to the magnification to be established with the use of the photoprinting light.

The auxiliary optical system is arranged to allow observation of a limited range of the image surface region (wafer surface region) corresponding to the effective exposure region 219, with the aid of displacement of the above-described optical components. When the observing position is to be shifted along the X axis, co-ordinated movement of the whole optical arrangement of the auxiliary optical system 209, not including the field lens 221 and the correcting lens 222, is sufficient to meet such shift along the X axis. Where the observing position is to be shifted in the Y-axis direction, the movement of the correcting plate 220 and the mirror 223 each in this direction by an amount $\Delta Y$ as well as the movement of the mirrors 224 and 226 and the correcting optical system 225, as a unit, in the same direction by an amount $\Delta Y/2$, for the correction of the optical path length, are required. It is to be noted that, for the displacement of the optical components at the time of shift of the detecting position, the coma-correcting plate 220 and the mirrors 228 and 229 may be held fixed provided that each of them has a sufficient area covering the detectable range of the detection system.

Subsequently, description will be made to the operations to be made in sequence in the exposure apparatus and by use of the detecting system (including two detecting units).

RETICLE SETTING I

When a new reticle such as at 201 is introduced into the exposure apparatus, it is necessary to set the reticle 201 with respect to a predetermined reference provided in the apparatus. For this purpose, the whole optical arrangement of the first microscope 208 or a portion thereof including the objective lens 214 is moved to a position that allows detection of reticle setting mark 217 (217'). In close vicinity of the pattern bearing surface 216 of the reticle 201 on which the reticle setting mark 217 (217') is formed, there is provided on the apparatus side a corresponding reticle reference mark, not shown. Actually, a pair of reticle reference marks corresponding to the pair of reticle setting marks 217 and 217' are fixedly formed on the apparatus, as will be understood from the foregoing description. By use of the reticle setting marks and the reticle reference marks, the alignment of the reticle 201 with respect to the exposure apparatus is accomplished. For this alignment purpose, either the alignment light of the wavelength equal to the photoprinting wavelength, from the guide 210, or the alignment light of the He-Ne wavelength 633 nm may be used. Also, both may be used.

RETICLE SETTING II

The reticle setting may be executed with respect to a wafer-stage reference plate 231 which is mounted to the wafer stage 207 at a position outside the wafer 202. If this is desired, the wafer stage 207 is first moved so that the center of the reference plate 231 is placed on or coincident with the optical axis of the projection lens system 203. On the other hand, the first microscope 208 is moved to a position that allows detection of a reticle setting mark 232 (232'). As seen in FIG. 8A, the reference plate 231 is formed with two alignment marks 662 and 662' spaced by an interval P which is in such relation to the interval S between the reticle setting marks 232 and 232' that can be expressed by an equation: $P=S \times$ "reduction ratio" of the projection lens system 203 (e.g. 1/5). For the reticle setting, the photoprinting-wavelength illumination system and the photoprinting-wavelength detection system of the first microscope 208 are used to observe or detect, simultaneously, the left-hand set of marks 232 and 662 and the right-hand set of marks 232' and 662'. On the basis of this detection, the alignment of the reticle 201 in the X, Y and $\theta$ (rotational) directions is attainable. Also, from the runout value of the two detecting units, any error $\Delta\beta$ in the magnification of the projection lens system 203 can be detected. The correction of such magnification error $\Delta\beta$ will be described later.

ON-AXIS ALIGNMENT USING LIGHT OF RESIST-SENSITIZING WAVELENGTH

When the first microscope 10 is to be used as an alignment system utilizing only the resist-sensitizing wavelength, it can be operated as an on-axis microscope not including the auxiliary optical system 209. If this is desired, the microscope 208 is moved to a position that allows detection of reticle alignment mark 233 (233') which is formed in a scribe region 234 defined around an actual-element pattern region 236 of the reticle 1. Of course, the unshown microscope corresponding to the first microscope 208 is moved similarly. Thus, the two reticle alignment marks 233 and 233' and the two wafer alignment marks MW are observed and detected simultaneously, thus allowing alignment with respect to the X, Y and $\theta$ directions as well as the detection of any error in the magnification $\beta$. In the case of on-axis alignment, it is necessary to retract the first microscope 208 out of the path of the photoprinting light at the time of "exposure".

As for the alignment marks to be used in various alignment operations, any one of a variety of alignment marks having various directional characteristics may be used in the present invention. An example is illustrated in FIG. 8B. In an exposure apparatus having multiple alignment modes as in the case of the present embodiment, it will be desirable to use marks having a common shape. In consideration thereof, in the present embodiment, each of the marks denoted by numerals 217, 217'; 218, 218'; 232, 232'; and 233, 233' is formed as a reticle mark having a configuration such as denoted at 666 in FIG. 8B, the hatched region depicting a light-intercepting region. For enhanced distinguishability of the marks for an operator and/or the exposure apparatus, these reticle marks may desirably have their own identification marks such as at 667 in FIG. 8B, having different configurations. As for the wafer alignment marks MW as well as other marks such as at 662 and 662' shown in FIG. 8A, each of these marks preferably has a configuration such as denoted at 668 in FIG. 8B. Similarly, these marks may preferably have their own identification marks such as denoted at 669.

OFFSET CORRECTION IN THE ALIGNMENT DETECTING SYSTEM USING 633 nm

The alignment system using the light of 633 nm in wavelength from the He-Ne laser uses the auxiliary optical system 209. This leads to a possibility that each alignment system involves an offset error, in the results of detection, which can not be avoided even by the setting of the optical arrangement thereof. It is therefore necessary to "read" and then correct the offset error once the setting of the optical arrangement is changed. In the present embodiment, however, the photoprinting or resist-sensitizing wavelength alignment mode using a portion of the first microscope 208 does not at all involve such systematic offset error. The present embodiment utilizes this. Namely, the sensitizing wavelength alignment by the first microscope 208 is used as a "reference" upon reading and correction of any offset error involved in the alignment systems using the wavelength 633 nm. The manner of detection and correction is as follows:

(1) First, the first microscope 208 is moved to a position that allows detection of the reticle alignment mark 233 (233'). Then, by use of the sensitizing wavelength alignment system, alignment marks 663 (663') formed on the reference plate 231 are brought into alignment with the reticle alignment mark 233 (233').

(2) The first microscope 10 is subsequently moved back to the position observing the reticle alignment marks 218 (218'), so as to detect the positional relation between the reticle alignment mark 218 (218') and the alignment mark 663 (663') of the reference plate 231 by the image sensor 215 and by use of the light supplied from the He-Ne laser 230 of the first microscope 208. From the amount of detected positional deviation, the offset error of the alignment system using the wavelength 633 nm is read.

ALIGNMENT USING 633 nm AND CONTROL SYSTEM THEREFOR

FIG. 4 shows the state of alignment using the wavelength 633 nm from the Ne-Ne laser. By the action of the optical components described in the foregoing, images of the wafer alignment mark MW and the reticle alignment mark 218 (218') are formed, simultaneously, on the image pickup device 215. The video signals obtained by the two image pickup devices (one of which is illustrated at 215), corresponding to the left-hand and right-hand reticle alignment marks 218 and 218', are supplied to a control circuit 241 in which these video signals are subjected to the image processing and the error calculation.

The signals obtained from the left-hand and right-hand alignment marks are resolved into components regarding two-dimensional X and Y directions. Then, by calculations including the compensation for the offset errors described hereinbefore, positional deviation components are determined in the form of $\theta XL$, $\theta YL$; $\theta XR$, $\theta YR$. Further, these deviation components are outputted from the control circuit 241 as the data concerning necessary moving directions and necessary moving amounts, such as follows:

$$\Delta X = (\Delta X_L \Delta X_R)/2$$

$$\Delta Y = (\Delta Y_L \Delta Y_R)/2$$

$$\Delta \theta = (\Delta Y_L - Y_R)/2$$

$$\Delta = (\Delta X_L - \Delta X_R)/2$$

These driving signals designating the necessary moving amounts in the X, Y and $\theta$ directions, are supplied to the wafer stage 207 from the control circuit 241 to control the movement of the wafer stage 207. The above-described detecting system and the driving system are operated in a closed loop so that the positional error is finally reduced to a value within a predetermined tolerance.

On the other hand, the signal designating any magnification error $\Delta \beta$ is supplied to the magnification-correcting optical system denoted at 242. The magnification-correcting optical system 242 is of the type described in Japanese Laid-Open Patent Application, Laid-Open No. 35620/1987.

After completion of the X-Y-$\theta$ alignment and the adjustment of the magnification $\beta$ made by the above-described operations, it is possible to instantaneously start the "exposure". Since the objective mirror 229 is out of the path of the photoprinting light, it is not necessary to retract the same. Moreover, it is possible to continue monitoring of the alignment position during the photoprinting operation, if desired.

The advantageous effects of the alignment device described in the foregoing can be summarized as follows:

(1) Use of plural alignment lights having different wavelengths and a variety of alignment modes, has prevented the detection error and the deterioration of the detection accuracy due to the nature of the process to be executed, and, as a result of which, has achieved stable and high-accuracy alignment regardless of the change in the process conditions.

(2) Even for the alignment operation using a non-photoprinting wavelength, the provision of the alignment system using the photoprinting wavelength has allowed automatic offset correction in the exposure apparatus. Also, the alignment system using the light of a wavelength 633 nm from the He-Ne laser allows simultaneous detection of the reticle alignment mark and the projected image of the wafer alignment mark. Therefore, it is not necessary to worry about any error in the reference due to aging.

(3) Since the aberrations are substantially completely corrected with respect to each of the different alignment wavelengths, it is possible to detect, with any alignment wavelength, positional deviation in two X and Y directions, on the basis of the single-point observation. As a consequence, the positional error in the X, Y and $\theta$ directions as well as any error in the magnification $\beta$ can be detected on the basis of two-point observation. Accordingly, more complete superimposition is attainable with the aid of adjustment of the wafer stage in the X, Y and $\theta$ directions and of the magnification correction by the correcting optical system 242.

(4) Even if the alignment mark is formed at a position in the actual device pattern, the exposure (photoprinting) can still be initiated immediately after completion of the alignment and without relative movement of the reticle and the wafer. This effectively reduces the cycle time as well as improves the alignment accuracy significantly.

FOCUS DETECTION AND ADJUSTMENT

Description will now be made to the focus detection and the focus adjustment. FIG. 5 schematically shows a TTL (through the lens) focus detecting system and a driving system for the focus adjustment, provided separately from the alignment detecting system described in the foregoing. The part (a) of FIG. 5 illustrates the focus detecting system and driving system in a schematic side view, while the part (b) of FIG. 5 illustrates a reticle in a plan view. The part (c) shows, in an enlarged view, the portion of the focus detecting system which is effective to divide the light from the wafer into three.

In FIG. 5, the same reference numerals as of FIG. 4 are assigned to the same elements. The provision of the parallel-surface plate 205 and the dichroic mirror 204 which are disposed in the path for the photoprinting light, does allow extraction of optical signals for the TTL focusing purpose. In the example of FIG. 5, three sets of focus detecting optical systems 300 are provided so as to detect any inclination component between the image surface defined by the projection lens system 203 and the portion of the wafer 202 surface which is going to be exposed. Considering in relation to the reticle 201 surface, these three sets of focus detecting optical systems 300 are disposed at equiangular positions corresponding to the points a, b and c on the outer periphery of the effective exposure region 219, as best seen in part (b) of FIG. 5. Only for the simplicity, description will be made to the focus detecting optical system related to the position a and a signal processing system in association therewith.

A light emitted from a He-Ne laser 301 and having a wavelength 633 nm, is transmitted through an illumination lens 302 and thereafter is reflected by a half prism 303 downwardly to the telecentricity-correcting plate 222. Thus, the light from the prism 303 is directed, by way of this correcting plate 222, the field lens 221, the aberration-correcting plate 307, the parallel-surface plate 205, the dichroic mirror 204, the projection lens system 203 and the magnification-correcting optical system 242, to the surface of the wafer 202 and is focused thereupon. The light reflected from the wafer 202 surface goes backwardly along its oncoming path so that it is incident upon the half prism 103. Then, the light from the wafer 2 is passed through the half prism 303 and enters into a "multistage" half mirror 304. A portion 309 including the mirror 304 is illustrated in an enlarged scale in part (c) of FIG. 5. This half mirror 304 functions to divide the incident light into three portions of substantially the same quantity along three optical axes denoted at R, J and F. Disposed behind the half mirror 304 is a pinhole plate 305 having formed therein three pinhole windows having centers coincident with the optical axes R, J and F, respectively. Behind the plate 305, three photoelectric converting elements 306R, 306J and 306F are disposed so as to be operationally associated with the three pinhole windows, respectively. The pinhole plate 305 is so set that, when the wafer 202 surface is exactly coincident with the image plane defined by the projection lens system 203, the light emitted from the so positioned wafer surface is imaged at the pinhole position on the optical axis J, while it is imaged behind the pinhole position on the optical axis R and is imaged in front of the pinhole position on the optical axis F.

With this arrangement, the direction of deviation of the wafer surface with respect to the image plane can be discriminated on the basis of mutual comparison of the outputs of the photoelectric converting elements 306R and 306F. Also, from the balance between the outputs of the photoelectric converting elements 306R and 306F or from the maximum output of the photoelectric converting element 306J, the coincidence of the wafer surface with the image plane can be detected. The electric signals obtained by the photoelectric conversion at the photoelectric converting elements 306R, 306J and 306F are supplied to a control circuit 308. In this manner, the state of focus is detected with respect to each of the wafer positions corresponding to the three points a, b and c. On the basis of the three point detection, the tilt correction of the wafer stage 207 is executed.

The series of operations described above are carried out in a closed loop as the TTL focusing using the projection lens system 203. Accordingly, the focus adjustment can satisfactorily follow the shift of image plane due to a change in an ambient pressure and/or ambient temperature as well as a rapid focus change resulting from absorption of the photoprinting light by the projection lens system 3. As a consequence, a correct focus can be retained stably and constantly.

Further, as a result of the execution of the three-point detection and the use of the tilt mechanism, the wafer surface can be made exactly coincident with the image plane. Therefore, uniform and superior resolution performance is attainable over the whole exposure range.

In a case of repeated exposures while moving the stage 207 in accordance with the measurement by a laser interferometer measuring system 230, such as in a case of a first mask process or a global alignment mode, there is a possibility that any tilt of each shot causes a problem of shot layout error (which appears as the variation in the width of the scribe line). Such a problem can be obviated by providing a reference mirror (square) 331 on the tilt stage 120.

It will be understood that the alignment optical system shown in FIG. 4 and the focus detecting optical system shown in FIG. 5 can be provided in an exposure apparatus, in combination, similarly as the case of the first embodiment.

Although the second embodiment of the present invention has been described with reference to a projection exposure apparatus having a projection lens system which is designed for use with the i-line rays, the alignment system and the focus detecting system can be arranged similarly in accordance with the present invention when it is desired to use them in a projection exposure apparatus having a projection lens system designed for use with a light of a short wavelength, e.g. 308 nm or 249 nm, from an excimer laser.

In a case of a projection lens system to be used with the excimer laser, the kind of glass materials usable as the lens material is very restricted. Typically, two kinds of glass materials are practically usable. It is therefore not easy to design the lens system so as to sufficiently correct the chromatic aberration. Also, there will be a large difference between the photoprinting wavelength and the alignment wavelength. As a consequence, there will occur a large amount of axial chromatic aberration. If this occurs, the image of the wafer alignment mark is formed at a position farther remote from the reticle. If, in such a case, a conventional type optical arrangement as illustrated in FIG. 9A or 9B is used, a pickup mirror 700 or a chromatic-aberration correcting lens 701 has to be replaced by one having a much larger size. Use of such a large pickup mirror or correcting lens disadvantageously results in an increase in the shading (as depicted by hatched regions in FIG. 9A and 9B). Accordingly, the effective exposure region is narrowed impracticably. It will be understood therefrom that use of a specific mirror arrangement of the present invention, in which the mirror "covers" the whole path of the photoprinting light, is very desirable.

The alignment detecting system illustrated in FIG. 1 or 4 may be used as the focus detecting system. In such a case, each of the systems using, respectively, the light of i-line rays, the light of 633 nm in wavelength and the light of 515 nm in wavelength, can detect the alignment mark in the image plane and by use of a CCD image sensor or an image pickup tube. Therefore, the optimum imaging point is detectable on the basis of the contrast.

The output of one alignment system using a particular wavelength can be used both, for the alignment detection purpose and the focus detection purpose. Also, it is possible to use the wavelength 633 nm for the alignment detection purpose, while using the wavelength 515 nm for the focus detection purpose. Moreover, such alignment detecting and focus detecting system as above can be used with the focus detecting system of the type illustrated in FIG. 2 or 5 which is provided, in the FIG. 2 or 5 embodiment, exclusively for the focus detection purpose.

The optical arrangement shown in FIG. 1 or 4 can be used as the alignment system only when the wafer is provided with a mark. In view of this, and in consideration of the first mask process, it is desirable to provide the exposure apparatus with a focus detecting system as illustrated in FIG. 2 or 5.

It will be apparent that the prism block included in the FIG. 1 embodiment can be replaced by a pellicle mirror, if desired.

Description will now be made to a third embodiment.

FIG. 6 schematically shows an alignment detecting system, an alignment driving system and a magnification-correcting driving system all included in an exposure apparatus according to the third embodiment of the present invention. The part (a) of FIG. 6 illustrates general structures of these systems in a side view, while part (b) of FIG. 6 shows, in a plan view, a reticle usable with the exposure apparatus. The part (c) shows a wafer stage reference plate 426 in a plan view.

In the apparatus of FIG. 6, a projection lens system 403 and a dichroic mirror 404 are provided so as to optically project a pattern, formed on a reticle 401, upon the surface of a wafer 402, i.e. to photoprint the reticle pattern on the wafer 402 surface. The projection lens system 403 is arranged so as to be telecentric on the reticle 402 side, so that it is of the single telecentric type. The dichroic mirror 404 is formed on a parallel-surface glass plate 405 and is disposed inclinedly by 45 degrees with respect to an optical axis of the projection lens system 403. Thus, the axis of reticle pattern projection is bent by 90 degrees by the dichroic mirror 404. As seen from FIG. 6, the dichroic mirror 404 is so disposed as to extend to cover the whole sectional range of the optical path defined by the projection lens system 403. The dichroic mirror 404 is made and disposed so as to reflect the light, to be used for the photoprinting, to the right-angle direction while transmitting light of a wavelength or wavelengths other than the photoprinting wavelength to which the resist material on the wafer shows sensitivity.

The reticle 401 is held by a reticle holder 406 by vacuum suction or the like. On the other hand, the wafer 402 is held by a movable wafer stage 407. The exposure, i.e. the photoprinting, is executed by illuminating the reticle 401 by use of an illumination optical system 495 disposed on the right-hand side of the reticle 401, as schematically illustrated in part (b) of FIG. 6.

The alignment detecting system can be divided into two blocks, i.e. a first microscope 408 and an auxiliary optical system 409. In the illustration of FIG. 1, for ease in understanding, the optical arrangement of the alignment detecting system is expanded in a plane. With regard to the co-ordinate system, for explanation, the Z-axis is set in the direction of the optical axis of the projection lens system 403, while the orthogonal X and Y axes are set in a plane perpendicular to the Z axis, as seen in part (b) of FIG. 6.

FIRST MICROSCOPE 408

In the first microscope 408, two light sources providing two kinds of alignment lights, respectively, are used. The first light source is a He-Ne laser 410 adapted to produce a laser beam of 633 nm in wavelength. The second light source is provided by introducing the light of the resist-sensitizing or photoprinting wavelength (e.g. an excimer laser beam) from the illumination optical system 495 by means of a light guide 411. These two kinds of alignment lights are directed to a beam splitter 412, whereby the light from the He-Ne laser is transmitted while the light of the photoprinting wavelength is reflected. The light as transmitted through or reflected by the beam splitter 412 is projected upon an illumination lens 413. The light from the illumination lens 413 passes through another beam splitter 414 and an objective lens 415 and, thereafter, is deflected by a mirror 416 toward the reticle 401 to irradiate a pattern bearing surface 417 of the reticle.

Inversely, the light reflected by the reticle 401 or the wafer 402 advances via the mirror 416 and the objective lens 415 to the beam splitter 414. By this beam splitter 414, the light is deflected toward an image sensor 418 and is imaged thereupon. As a matter of course, the objective lens 415 is designed so that aberrations are satisfactorily corrected with respect to two wavelengths, i.e. the resist-sensitizing wavelength and the wavelength (633 nm) of the He-Ne laser beam. Also, the objective lens 415 has a diametrical size sufficient to accept any change in the angle of inclination due to a change in the image height (alignment mark position).

In the first microscope 408, the whole optical arrangement thereof is made movable so as to allow observation of reticle setting marks 419 and 419' and reticle alignment marks 420 and 420' (the part b in FIG. 6) as well as almost all of an effective exposure region 421 defined on the reticle 401.

AUXILIARY OPTICAL SYSTEM 409

The auxiliary optical system 409 is provided in order (i) to direct, to an alignment mark M formed on the wafer 2, the He-Ne laser beam emitted from the first microscope 408 and passed through the reticle alignment mark, and also (ii) to direct backwardly the He-Ne laser beam, reflected from the wafer alignment mark M, to the reticle 401. More specifically, the light reflected from the wafer alignment mark is projected by the projection lens system 403 upon the dichroic mirror 404, and the light incident thereupon passes therethrough and through the parallel-surface plate 405 supporting the dichroic mirror 404. The light passed through the dichroic mirror 404 enters again the auxiliary optical system 409, from which the light is directed and imaged upon the pattern bearing surface 417 of the reticle 401, close to the reticle alignment mark 420. At this time, the astigmatism and the coma caused by the passage of the light through the projection lens system 403 and the parallel-surface plate 405 are corrected in the auxiliary optical system 409. More particularly, the astigmatism is corrected by an astigmatism-correcting optical system 422 which comprises, in this embodiment, two parallel-surface glass plate. As regards the coma, it is cancelled by passing the light through the parallel-surface plate 405 again after the orientation of the image is changed in the auxiliary optical system 409.

The structure of the auxiliary optical system 409 will now be described, in terms of the light reflected from the wafer alignment mark M. The light from the wafer alignment mark M is projected upon the dichroic mirror 404 by the projection lens system 3. If the dichroic film is replaced by an ordinary mirror which is reflective also to the alignment light, then the light will be imaged at a point P which is at a distance A beyond the pattern bearing surface 417 of the reticle 401. This is because of the longitudinal or axial chromatic aberration caused by the projection lens system 403. When a light of a wavelength 633 nm (He-Ne laser beam) is used with a projection lens system designed for exclusive use with an excimer laser beam, as in the present embodiment, the distance A will be of an order of several hundreds of milimeters. If, in such a case, it is desired to detect optical signals concerning the wafer 402 from the back of the reticle 401, it will be necessary to form a large window in the pattern bearing surface 417 of the reticle 401. However, the provision of such a window is practically impermissible.

This is the reason why the inventors have proposed the illustrated arrangement to temporarily extract the optical signals concerning the wafer 402 out of the path, defined for the photoprinting light, between the reticle 401 and the projection lens system 403. The light transmitted through the dichroic mirror 404 and the parallel-surface plate 405 is reflected by mirrors 423 and 424 toward a pentagonal prism 425. By this pentagonal prism 425 the orientation of the image is changed. The light emerging from the prism 425 passes through the astigmatism correcting optical system 422 by which the astigmatism is corrected. Thereafter, the light is transmitted again through the parallel-surface plate 405 with the image orientation being inverted. By this, the coma is corrected. The light from the parallel-surface plate 405 is incident upon the reticle alignment mark 420.

Subsequently, description will be made to the operations to be made in sequence in the exposure apparatus and by use of the detecting system.

RETICLE SETTING I

When a new reticle such as at 401 is introduced into the exposure apparatus, it is necessary to set the reticle 401 with respect to a predetermined reference provided in the apparatus. For this purpose, a portion of the optical arrangement of the microscope 408 such as the objective lens 415 and the like is moved to a position that allows detection of the reticle setting mark 419 (419'). In close vicinity of the pattern bearing surface 417 of the reticle 401 on which the reticle setting mark 419 (419') is formed, there is fixedly provided on the apparatus side a corresponding reticle reference mark, not shown. The image pickup device 418 of the first microscope 408 is used to observe, simultaneously, the reference mark and the reticle setting mark 419 to thereby detect any positional deviation therebetween. Also, a similar detecting operation is made to the reticle setting mark 419' In this manner, the alignment of the reticle setting mark 419 (419') and the reference mark is accomplished. For this alignment purpose, either the alignment light of the resist-sensitizing wavelength or the alignment light of the wavelength 633 nm (He-Ne light) may be used. Also, both may be used.

RETICLE SETTING II

The reticle setting may be executed with respect to a wafer-stage reference plate 426 which is mounted to the wafer stage 407 at a position outside the wafer 402. If this is desired, the wafer stage 407 is first moved so that the center of the reference plate 426 is placed on or coincident with the optical axis of the projection lens system 403. On the other hand, the first microscope 408 is moved to a position that allows detection of a reticle setting mark 427 (427'). As seen in part (c) of FIG. 6, the reference plate 426 is formed with two alignment marks 428 and 428' spaced by an interval l which is in such relation to the interval $S_1$ between the reticle setting marks 427 and 427' that can be expressed by an equation $l = S_1 \cdot$ "reduction ratio" of the projection lens system 403 (e.g. 1/5). For the reticle setting, the photoprinting wavelength illumination system and the photoprinting wavelength detection system of the first microscope 408 are used to observe or detect the left-hand set of marks 427 and 428 and the right-hand set of marks 427' and 428'. On the basis of this detection, the alignment of the reticle 401 in the X, Y and $\theta$ (rotational) directions is attainable. Also, from the runout value of the two-point detection, any error $\Delta\beta$ in the magnification of the projection lens system 403 can be detected. The correction of such magnification error $\Delta\beta$ will be described later.

ON-AXIS ALIGNMENT USING RESIST-SENSITIZING WAVELENGTH

When the first microscope 408 is to be used as an alignment system utilizing only the photoprinting wavelength, it can be operated as an on-axis microscope not including the auxiliary optical system 409. If this is desired, the microscope 408 is moved to positions each allowing detection of reticle setting mark 427 (427') which is formed in a scribe region 429 defined around an actual-element pattern region of the reticle 401. By this, the reticle setting marks 427 and 427' and the wafer alignment marks are detected, whereby the alignment with respect to the X, Y and $\theta$ directions as well as the detection of any error in the magnification $\beta$ are accomplished. In this case, the first microscope 408 has to be retracted out of the path of the photoprinting light at the time of "exposure".

OFFSET CORRECTION IN THE ALIGNMENT DETECTING SYSTEM USING HE-NE BEAM

The alignment system using the light of 633 nm in wavelength from the He-Ne laser uses the auxiliary optical system 409. This leads to a possibility that the alignment system involves an offset error, in the results of detection, which cannot be avoided even by the setting of the optical arrangement thereof. It is therefore necessary to "read" and then correct the offset error. In the present embodiment, however, the photoprinting wavelength alignment mode using the first microscope 408 does not at all involve such systematic offset error. The present embodiment utilizes this. Namely, the photoprinting wavelength alignment by the first microscope 408 is used as a "reference" upon reading and correction of any offset error involved in the alignment system using the wavelength 633 nm. The manner of detection and correction is as follows:

(1) First, the first microscope 408 is moved to a position that allows detection of the reticle setting mark 427 (427'). Then, by use of the photoprinting wavelength alignment system, alignment marks 428 (428') formed on the reference plate 426 are brought into alignment with the reticle setting mark 427 (427').

(2) Then, the first microscope 408 is moved toward the reticle alignment mark 420.

(3) Where the interval between the reticle alignment mark 420 and the reticle setting mark 427 is $S_2$, the wafer stage 407 is moved so as to displace the reference plate 426 in the X direction, as viewed in part (c) of FIG. 6, by an amount $S_2 \cdot$ "reduction ratio" of the projection lens system (e.g. 1/5).

(4) Then, by use of the alignment system using the He-Ne laser beam included in the first microscope 408, the marks 420 and 428 are detected. Thus, the offset error of He-Ne laser beam alignment system can be read by the image pickup device 418.

By the above-described operations, the detection (correction) of the offset error is accomplished.

ALIGNMENT USING HE-NE BEAM AND CONTROL SYSTEM Therefor

Under the influence of the action of the optical components described hereinbefore, the image of the wafer alignment mark and the image of the reticle alignment mark 420 are formed, simultaneously, upon the image sensor 418 of the first microscope 408, with the aid of the movement of the wafer stage 407 by a predetermined distance. The video signals obtained at the image sensor 418 are supplied to a control circuit 430, in which the image processing and the error calculation are executed. The signals obtained from the left-hand and right-hand marks are resolved into the components regarding the two-dimensional X and Y directions. Then, by calculations including the compensation for the offset error described hereinbefore, data concerning positional deviation components in the X, Y and $\theta$ directions is outputted from the control circuit 430, so as to be used for the position adjustment of the wafer stage 407 in these directions.

The driving signals designating the necessary moving amounts in the X, Y and $\theta$ directions are supplied to the wafer stage from the control circuit 430, to thereby control the movement of the wafer stage 407. The above-described detecting system and the driving system are operated in a closed loop so that the positional error is finally reduced to a value within a predetermined tolerance.

On the other hand, the signal designating any magnification error a is supplied to a magnification-correcting optical system 431 which is similar to the correcting optical system 242 of the second embodiment.

After completion of the X-Y-$\theta$ alignment and the adjustment of the magnification $\beta$ made by the above-described operations, it is possible to instantaneously start the "exposure". Since the objective mirror 416 is out of the path of the photoprinting light, it is not necessary to retract the same.

The advantageous effects of the alignment device described in the foregoing can be summarized as follows:

(1) Use of plural alignment lights having different wavelengths and a variety of alignment modes, has prevented the detection error and the deterioration of the detection accuracy due to the nature of the process to be executed, and, as a result of which, has achieved stable and high-accuracy alignment regardless of the change in the process conditions.

(2) Even for the alignment operation using a non-photoprinting wavelength, the provision of the alignment system using the photoprinting wavelength has allowed automatic offset correction in the exposure apparatus. Also, the alignment system using the light of a wavelength 633 nm from the He-Ne laser allows simultaneous detection of the reticle alignment mark and the projected image of the wafer alignment mark. Therefore, it is not necessary to worry about any error in the reference due to aging.

(3) Since the aberrations are substantially completely corrected with respect to each of the different alignment wavelengths, it is possible to detect, with any alignment wavelength, positional deviation in two X and Y directions, on the basis of the single-point observation. As a consequence, the positional error in the X, Y and $\theta$ directions as well as any error in the magnification $\beta$ can be detected with the aid of the movement of the stage. Accordingly, more complete superimposition is attainable with the aid of adjustment of the wafer stage in the X, Y and $\theta$ directions and of the magnification correction by the correcting optical system 431.

(4) Even if the alignment mark is formed in the actual device pattern, the alignment is easy to achieve.

FOCUS DETECTION AND ADJUSTMENT

Description will now be made of the focus detection and the focus adjustment. FIG. 7 schematically shows a TTL (through the lens) focus detecting system and a driving system for the focus adjustment, provided separately from the alignment detecting system described in the foregoing. The part (a) of FIG. 7 illustrates the focus detecting system and the driving system in a schematic side view, while part (b) of FIG. 7 illustrates a reticle in a plan view.

In FIG. 7, the same reference numerals as of FIG. 6 are assigned to the same elements. The provision of the parallel-surface plate 405 and the dichroic mirror 404, which are disposed in the path for the photoprinting light, does allow extraction of optical signals for the TTL focusing purpose. In the example of FIG. 7, three sets of focus detecting optical systems 500 are provided so as to detect any inclination component between the image surface defined by the projection lens system 403 and the portion of the wafer 402 surface which is going to be exposed. Considering in relation to the reticle 401 surface, these three sets of focus detecting optical systems 500 are disposed at equiangular positions corresponding to the points a, b and c on the outer periphery of the effective exposure region 421, as best seen in part (b) of FIG. 7. Only for the simplicity, description will be made to the focus detecting optical system related to the position a and a signal processing system in association therewith.

A light emitted from a He-Ne laser 501 and having a wavelength 633 nm, is transmitted through an illumination lens 502 and thereafter is reflected by a half prism 503 toward a reflector 507. The light reflected by the reflector 507 is directed to the wafer 402 by way of the parallel-surface plate 405, the dichroic mirror 404, the projection lens system 403 and the magnification correcting optical system 431. Finally, the light passed through the correcting optical system 431 is focused upon the wafer 402 surface. The light reflected from the wafer 402 surface goes backwardly along its oncoming path so that it is incident upon the half prism 503. Then, the light from the wafer 402 is passed through the half prism 503 and enters into a "multistage" half mirror 504. This half mirror 504 functions to divide the incident light into three portions of substantially the same quantity along three optical axes denoted at R, J and F. Disposed behind the half mirror 504 is a pinhole plate 505 having formed therein three pinhole windows having centers coincident with the optical axes R, J and F, respectively. Behind the plate 505, three photoelectric converting elements 506R, 506J and 506F are disposed so as to be operationally associated with the three pinhole windows, respectively. The pinhole plate 505 is so set that, when the wafer 402 surface is exactly coincident with the image plane defined by the projection lens system 403, the light emitted from the so positioned wafer surface is imaged at the pinhole position on the optical axis J, while it is imaged behind the pinhole position on the optical axis R and is imaged in front of the pinhole position on the optical axis F.

With this arrangement, the direction of deviation of the wafer surface with respect to the image plane can be discriminated on the basis of mutual comparison of the outputs of the photoelectric converting elements 506R and 506F. Also, from the balance between the outputs of the photoelectric converting elements 506R and 506F or from the maximum output of the photoelectric converting element 506J, the coincidence of the wafer surface with the image plane can be detected. The electric signals obtained by the photoelectric conversion at the photoelectric converting elements 506R, 506J and 506F are supplied to a control circuit 508. In this manner, the tilt correction of the stage 407, at the three points corresponding to the points a–c, can be executed.

The series of operations described above are carried out in a closed loop as the TTL focusing using the projection lens system 403. Accordingly, the focus adjustment can satisfactorily follow the shift of image plane due to a change in an ambient pressure and/or ambient temperature as well as a rapid focus change resulting from absorption of the photoprinting light by the projection lens system 403. As a consequence, a correct focus can be retained stably and constantly.

Further, as a result of the execution of the three-point detection and the use of the tilt mechanism, the wafer surface can be made exactly coincident with the image plane. Therefore, uniform and superior resolution performance is attainable over the whole exposure range.

In a case of repeated exposures while moving the stage 407 in accordance with the measurement by a laser interferometer measuring system 530, such as in a case of a first mask process or a global alignment mode, there is a possibility that any tilt of each shot causes a problem of shot layout error (which appears as the variation in the width of the scribe line). Such problem can be obviated by providing a reference mirror (square) 531 on the tilt stage, such as shown in FIG. 7.

The alignment detecting optical system shown in FIG. 6 and the focus detecting optical system shown in FIG. 7 can be provided in an exposure apparatus, in combination, without interference therebetween.

While the embodiment of FIG. 6 has been described with reference to a projection exposure apparatus having a projection lens system designed for use with the excimer laser beam, the alignment system of the present embodiment is applicable to a projection exposure apparatus having a projection lens system which is arranged to be used with i-line rays (195 nm in wavelength) and which shows less axial chromatic aberration. If this is desired, the pentagonal prism of the auxiliary optical system 409 may be replaced by a relay lens effective to invert the image. Also, as for the focus detecting optical system in such a case, a similar arrangement is usable, although the correction of the optical path length is necessary.

In a case where an excimer laser beam is used for the photosensitive as in the present embodiment, it is desirable to use a fluorescent plate preferably disposed at a position optically conjugate with the surface of the image sensor, so that the mark is photoelectrically detected through the fluorescent plate. By this, the signal-to-noise ratio can be improved significantly.

As has hitherto been described in the foregoing, the present invention provides a projection exposure apparatus having detecting means and correcting (or driving) means operable in regard to all directions (X, Y, Z, $\theta z$, $\theta x$, $\theta y$ and $\beta$ which is the magnification) in relation to the superimposition of the reticle and the wafer as well as the "exposure", and wherein various operations can be carried out in a reduced time.

Further, the projection exposure apparatus of the present invention has a performance that can sufficiently meet the change in the process. Also, any error in the wafer and any error in the pattern having been photoprinted on the wafer, as well as any error or change in the characteristics of the apparatus caused with time, can be corrected within the apparatus itself. Accordingly, the superior performance of the apparatus can be held constant.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   a first stage for supporting an original
   a second stage for supporting a workpiece;
   a first light source for producing first light having a first wavelength;
   a second light source for producing second light having a second wavelength different from the first wavelength;
   a third light source for producing third light having a third wavelength different from the first and second wavelengths;
   a projection lens system disposed between said first and second stages for projecting an image of a pattern of the original onto the workpiece with the first light to transfer the pattern of the original onto the workpiece;
   first image forming means for illuminating the workpiece with the second light, for receiving light reflected from the workpiece and passed through said projection lens system, and for projecting an image of a mark of the workpiece onto the original with the reflected light of the second wavelength received thereby, said first image forming means comprising a first correction optical system for correcting astigmatism and coma from chromatic aberration produced by said projection lens system due to the difference in wavelength between the first and second light; and second image forming means for illuminating the workpiece with the third light, for receiving light reflected from the workpiece and passed through said projection lens system, and for projecting an image of the mark of the workpiece onto a predetermined plane, different from the original, with the reflected light of the third wavelength received thereby, said second image forming means comprising a second correction optical system for correcting astigmatism and coma from chromatic aberration produced by said projection lens system due to the difference in wavelength between the first and third light.

2. An apparatus according to claim 1, further comprising a dichroic mirror member disposed between said first stage and said projection lens system, wherein each of said first and second image forming means comprise means for receiving light reflected from the workpiece and received from said projection lens system and said dichroic mirror member.

3. A projection exposure apparatus, comprising:
a first stage for supporting an original;
a second stage for supporting a workpiece;
a light source for producing first light having a first wavelength;
a projection lens system disposed between said first and second stages for projecting an image of a pattern of the original onto the workpiece with the first light to transfer the pattern of the original onto the workpiece; and a mark detecting optical system comprising a correction optical system, a movable objective lens movable along the surface of the original for observation of first and second marks provided at different positions on the original, and means for illuminating, through said objective lens, the original and the workpiece with light having substantially the same wavelength as the first light and for directing light reflected from the workpiece to the original through said projection lens system to project an image of a mark of the workpiece onto the original to thereby detect the first mark of the original and the mark of the workpiece, said mark detecting optical system further comprising means for illuminating, through said objective lens, the original and the workpiece with second light having a second wavelength different from the first wavelength, and for directing light reflected from the workpiece to the original through said projection lens system and said correction optical system to project an image of the mark of the workpiece onto the original to thereby detect the second mark of the original and the mark of the workpiece;

wherein said correction optical system comprises means for correcting astigmatism and coma from chromatic aberration produced by said projection lens system due to the difference in wavelength between the first and second light.

4. An apparatus according to claim 3, further comprising a dichroic mirror member disposed between said first stage and said projection lens system, wherein said mark detecting optical system comprises means for receiving light reflected from the workpiece and received from said projection lens system and said dichroic mirror member.

* * * * *

UNITED STATES PATENT AND TRADEMARK OFFICE
CERTIFICATE OF CORRECTION

PATENT NO. : 5,137,363               Page 1 of 5
DATED : August 11, 1992
INVENTOR(S) : Masao Kosugi, et al.

It is certified that error appears in the above-identified patent and that said Letters Patent is hereby corrected as shown below:

ON THE COVER PAGE

IN ITEM [56] References Cited

UNDER "U.S. PATENT DOCUMENTS"

Insert:

```
--4,299,505   5/1981  Mayer .................. 355/62
  4,357,100  11/1982  Mayer, et al. .......... 355/62
  4,614,432   9/1986  Kuniyoshi, et al. ...... 356/401
  4,690,529   9/1987  Sugiyama, et al. ....... 353/122
  4,888,614  12/1989  Suzuki, et al. ......... 355/43--.
```

COLUMN 1

Line 48, "light, bearing" should read --light-bearing--.

COLUMN 2

Line 59, "invervention" should read --intervention--.

UNITED STATES PATENT AND TRADEMARK OFFICE
CERTIFICATE OF CORRECTION

PATENT NO. : 5,137,363

DATED : August 11, 1992

INVENTOR(S) : Masao Kosugi, et al.

It is certified that error appears in the above-identified patent and that said Letters Patent is hereby corrected as shown below:

COLUMN 5

Line 23, "i(a)" should read --1(a)--.

COLUMN 8

Line 2, "milimeters." should read --millimeters.--; and
Line 57, "copending" should be deleted.

COLUMN 12

Lines 19 through 21, "ALIGNMENT USING 633nm AND 515 nm AND CONTROL SYSTEM THEREFOR" should be centered as a heading.

COLUMN 14

Line 67, "improve" should read --improves--.

COLUMN 15

Line 3, "to" should read --of--; and
Line 28, "to" should read --of--.

UNITED STATES PATENT AND TRADEMARK OFFICE
CERTIFICATE OF CORRECTION

PATENT NO. : 5,137,363

DATED : August 11, 1992

INVENTOR(S) : Masao Kosugi, et al.

It is certified that error appears in the above-identified patent and that said Letters Patent is hereby corrected as shown below:

COLUMN 16

Line 15, "convertors" should read --converters--; and
Line 27, "title" should read --tilt--.

COLUMN 17

Line 52, "system 95" should read --system 295--.

COLUMN 21

Line 17, "can not" should read --cannot--;
Line 51, "Ne-Ne" should read --He-Ne--;
Line 67, "θXL, θYL;" should read --$\Delta X_L$, $\Delta Y_L$;--; and
Line 68, "θXR, θYR." should read --$\Delta X_R$, $\Delta Y_R$.--.

COLUMN 22

Line 5, "$\Delta X=(\Delta X_L \Delta X_R)/2$" should read --$\Delta X=(\Delta X_L+\Delta X_R)/2$--;
Line 7, "$\Delta Y=(\Delta Y_L \Delta Y_R)/2$" should read --$\Delta Y=(\Delta Y_L+\Delta Y_R)/2$--;
Line 9, "$\Delta\theta=(\Delta Y_L-Y_R)/2$" should read --$\Delta\theta=(\Delta Y_L-\Delta Y_R)/2$--;
Line 11, "$\Delta=(\Delta X_L-\Delta X_R)/2$" should read --$\Delta\beta=(\Delta X_L-\Delta X_R)/2$--;
Line 28, "βmade" should read --β made--; and
Line 58, "two" should read --the--.

UNITED STATES PATENT AND TRADEMARK OFFICE
CERTIFICATE OF CORRECTION

PATENT NO. : 5,137,363

DATED : August 11, 1992

INVENTOR(S) : Masao Kosugi, et al.

It is certified that error appears in the above-identified patent and that said Letters Patent is hereby corrected as shown below:

COLUMN 23

Line 51, "prism 103." should read --prism 303.--.

COLUMN 24

Line 28, "system 3." should read --system 203.--.

COLUMN 27

Line 24, "system 3." should read --system 403.--; and
   Line 35, "milimeters." should read --millimeters.--.

COLUMN 29

Line 35, "Therefor" should read --THEREFOR--; and
   Line 64, "a" should read --Δß--.

UNITED STATES PATENT AND TRADEMARK OFFICE
CERTIFICATE OF CORRECTION

PATENT NO. : 5,137,363

DATED : August 11, 1992

INVENTOR(S) : Masao Kosugi, et al.

It is certified that error appears in the above-identified patent and that said Letters Patent is hereby corrected as shown below:

COLUMN 30

Line 28, "two" should read --the--.

COLUMN 32

Line 51, "original" should read --original;--.

Signed and Sealed this

Ninth Day of November, 1993

Attest:

BRUCE LEHMAN

Attesting Officer          Commissioner of Patents and Trademarks